(12) United States Patent
Tarui

(10) Patent No.: US 7,919,403 B2
(45) Date of Patent: Apr. 5, 2011

(54) METHOD OF MANUFACTURING SILICON CARBIDE SEMICONDUCTOR DEVICE

(75) Inventor: Yoichiro Tarui, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/627,403

(22) Filed: Nov. 30, 2009

(65) Prior Publication Data

US 2010/0291762 A1 Nov. 18, 2010

(30) Foreign Application Priority Data

May 14, 2009 (JP) .................... 2009-117636

(51) Int. Cl.
*H01L 21/22* (2006.01)
(52) U.S. Cl. ................. 438/542; 257/E21.056
(58) Field of Classification Search .......... 438/369, 438/542, 545, 546, 549, 570; 257/E21.049, 257/E21.056, E21.064, E21.135
See application file for complete search history.

(56) References Cited

U.S. PATENT DOCUMENTS

| 4,780,426 | A | | 10/1988 | Koshino et al. |
| 6,040,237 | A | * | 3/2000 | Bakowski et al. ............ 438/521 |
| 2006/0118812 | A1 | | 6/2006 | Ohtsuka et al. |
| 2009/0250705 | A1 | | 10/2009 | Watanabe et al. |

FOREIGN PATENT DOCUMENTS

| JP | 63-93153 | 4/1988 |
| JP | 2002-185015 | 6/2002 |
| JP | 2006-165225 | 6/2006 |
| WO | WO 98/02924 | 1/1998 |
| WO | WO 99/67825 | 12/1999 |
| WO | WO 02/49114 A2 | 6/2002 |

OTHER PUBLICATIONS

U.S. Appl. No. 12/621,963, filed Nov. 19, 2009, Tarui.

* cited by examiner

*Primary Examiner* — Quoc D Hoang
(74) *Attorney, Agent, or Firm* — Oblon, Spivak, McClelland, Maier & Neustadt, L.L.P.

(57) ABSTRACT

A method of manufacturing a silicon carbide semiconductor device is provided that includes a step of forming in a surface of a silicon carbide wafer of first conductivity type a first region of second conductivity type having a predetermined space thereinside by ion-implanting aluminum as a first impurity and boron as a second impurity; a step of forming a JTE region in the surface of the silicon carbide wafer from the first region by diffusing the boron ion-implanted in the first region toward its neighboring zones by an activation annealing treatment; a step of forming a first electrode on the surface of the silicon carbide wafer at the space inside the first region and at an inner part of the first region; and a step of forming a second electrode on the opposite surface of the silicon carbide wafer. Thereby, a JTE region can be formed that has a wide range of impurity concentration and a desired breakdown voltage without increasing the number of steps of the manufacturing process.

18 Claims, 17 Drawing Sheets

METHOD OF MANUFACTURING SILICON CARBIDE SEMICONDUCTOR DEVICE

BACKGROUND OF THE INVENTION

1. Field of the Invention

The present invention relates to methods of manufacturing a silicon carbide semiconductor device, more particularly relates to a method of preparing a terminal structure of the silicon carbide semiconductor device.

2. Description of the Related Art

A silicon carbide semiconductor device that uses silicon carbide (SiC) for its substrate material is known as a semiconductor device excellent in breakdown voltage and temperature characteristics in comparison with a silicon semiconductor device that uses silicon (Si), a conventional substrate material. While various silicon carbide semiconductor devices have been proposed, many difficulties to be solved still exist against realization of a silicon carbide semiconductor device applicable to practical use. One of these difficulties is considerable lowering of breakdown voltage of semiconductor device due to an electric field concentration arising at, for example, the edge of a Schottky electrode in a Schottky barrier diode (SBD), or the edge of a PN junction in a PN diode or in a metal oxide semiconductor field effect transistor (MOSFET).

A terminal structure called "junction termination extension (JTE)" has been known as a structure for relaxing such an electric field concentration arising at the edge of a Schottky electrode or a PN junction.

The JTE is a p-type region (hereinafter, referred to as "JTE region") that is provided extending from the edge of a Schottky electrode or of a PN junction heading toward its peripheral region, in which a concentration of impurities decreases stepwise. In other words, the JTE region is formed of a plurality of p-type portions with different impurity concentrations that decrease stepwise from the edge of the Schottky electrode or the PN junction toward its peripheral region. In this way, by forming a p-type region having such an impurity concentration decreasing stepwise toward its peripheral region from the edge of a Schottky electrode or a PN junction thereby to realize a wide range of impurity concentration in the region, a JTE region having a desired breakdown voltage has been obtained. See, for example, Japanese Patent Applications Publication No. 2006-165225A and International Patent Application Publication No. WO98/02924.

As described above, in order to form a JTE region having a desired breakdown voltage, a plurality of p-type portions needs to be formed with different impurity concentrations decreasing stepwise from the edge of a Schottky electrode or a PN junction toward its peripheral region. Forming such a plurality of p-type portions requires processing steps for the number of p-type portions to be formed. For example, at least three steps, i.e., a mask formation step, an ion-implantation step, and a mask removal step are needed to form one p-type portion. Thus, the process of these three steps is needed for the number of p-type portions to be formed.

SUMMARY OF THE INVENTION

The present invention is made to address such a problem as described above, and an object of the invention is to provide a method of manufacturing a silicon carbide semiconductor device, in which a JTE region having a wide range of impurity concentration and a desired breakdown voltage can be formed easily without increasing the number of steps of the manufacturing process.

A method of manufacturing a silicon carbide semiconductor device according to the present invention includes a step of forming in a surface of a silicon carbide wafer of first conductivity type a first region of second conductivity type having a predetermined space thereinside by ion-implanting a first impurity that is non-diffusible during an activation annealing treatment and can form a second conductivity type region in the silicon carbide wafer and a second impurity that is diffusible during the activation annealing treatment and can form a second conductivity type region in the silicon carbide wafer; a step of forming a JTE region in the surface of the silicon carbide wafer from the first region by diffusing the second impurity ion-implanted in the first region toward its neighboring zones by the activation annealing treatment; a step of forming a first electrode on the surface of the silicon carbide wafer at the space inside the first region and at an inner part of the first region; and a step of forming a second electrode on the opposite surface of the silicon carbide wafer.

According to the invention, a first region of second conductivity type is formed in a surface of a silicon carbide wafer of first conductivity type by ion-implanting a first impurity that is non-diffusible during an activation annealing treatment and can form a second conductivity type region in the silicon carbide wafer and a second impurity that is diffusible during the activation annealing treatment and can form a second conductivity type region in the silicon carbide wafer; after that, a JTE region is formed in the surface of the silicon carbide wafer by diffusing the second impurity ion-implanted in the first region toward its neighboring zones by the activation annealing treatment. Therefore, a method of manufacturing a silicon carbide semiconductor device can be provided that is able to form a JTE region having a wide range of impurity concentration and a desired breakdown voltage without increasing the number of steps of the manufacturing process.

BEST MODE FOR CARRYING OUT THE INVENTION

Embodiment 1

The present invention will become more apparent by describing in detail non-limiting embodiments thereof with reference to the attached drawings.

Figure 1:
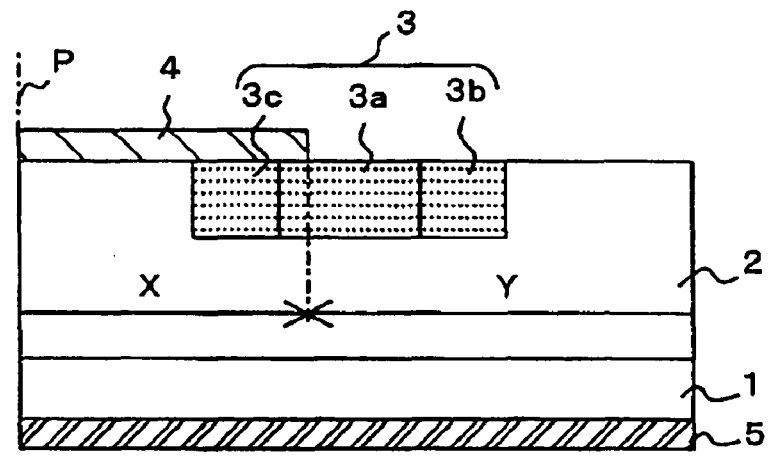
FIG. 1 is a cross-sectional view illustrating a structure of a Schottky barrier diode (SBD) of a silicon carbide semiconductor device according to Embodiment 1 of the present invention.
Figure 2:
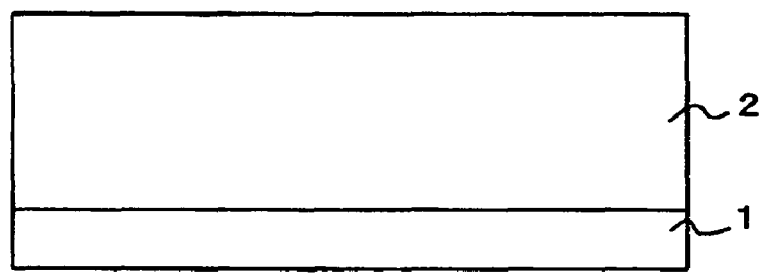
FIGS. 2 to 5 are views illustrating steps in the manufacturing process for the SBD according to Embodiment 1.
Figure 3:
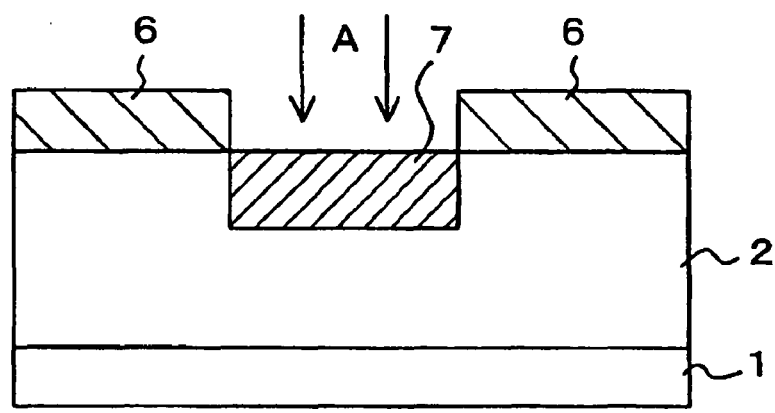
Figure 4:
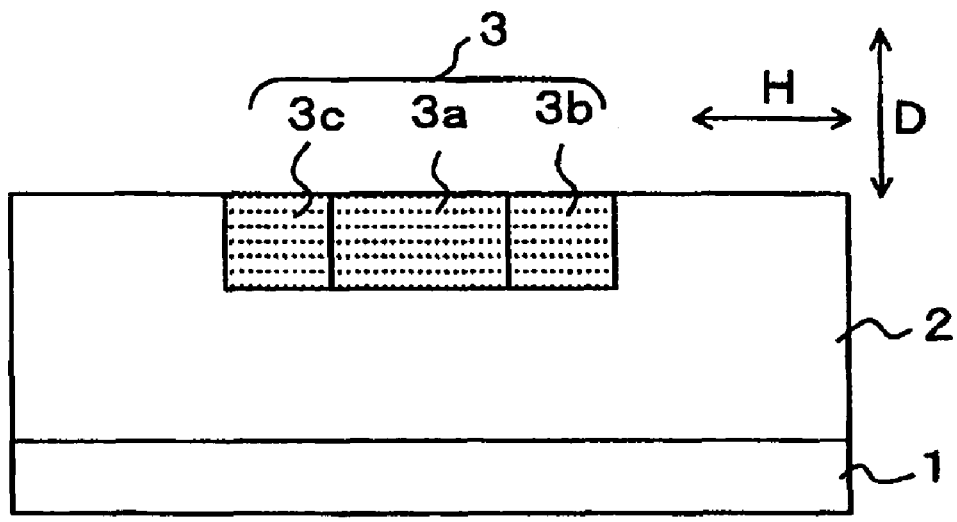
Figure 5:
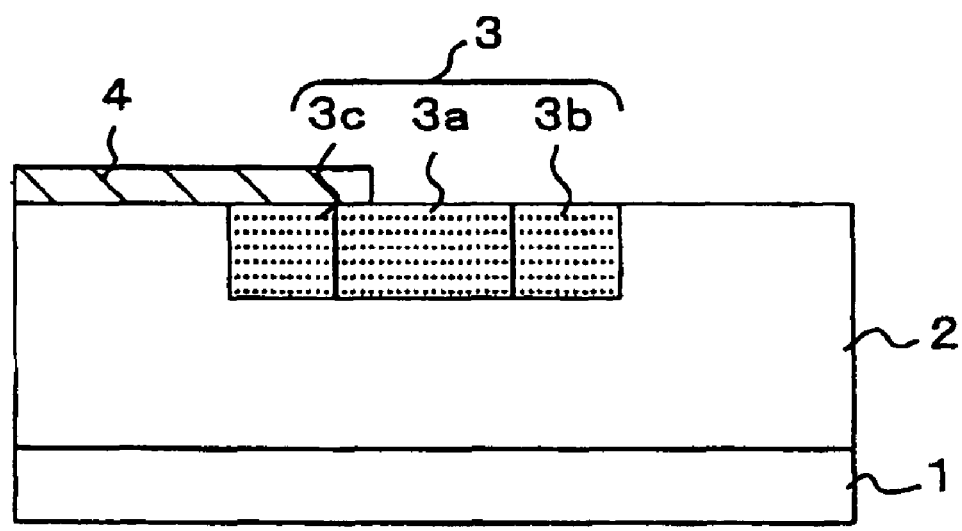
Figure 6:
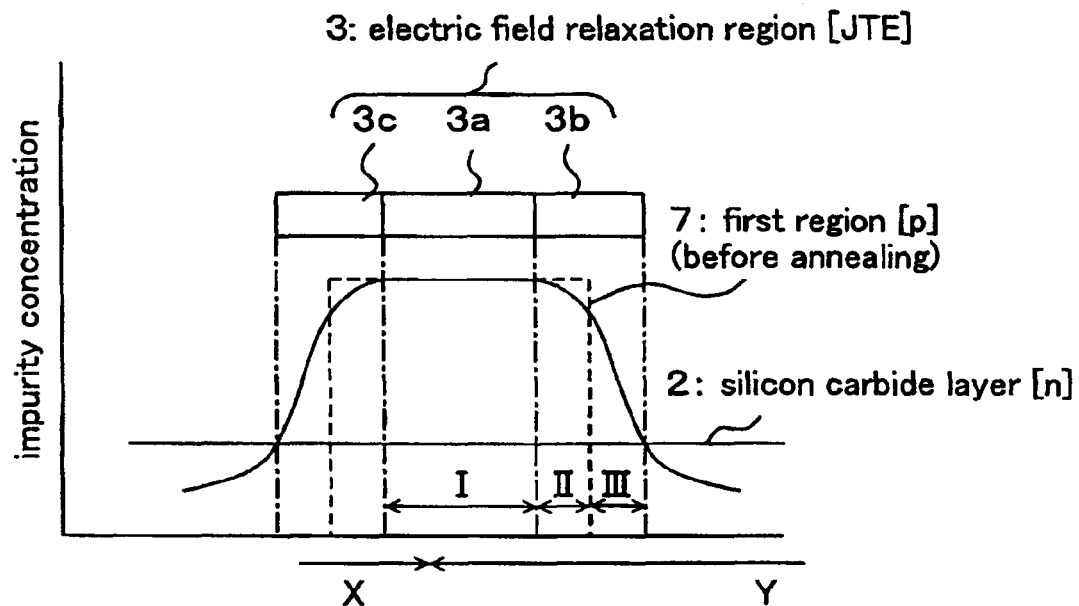
FIG. 6 is a graph illustrating a concentration profile of p-type impurities in the JTE region after annealing treatment, of the SBD according to Embodiment 1.

A silicon carbide semiconductor device according to Embodiment 1 of the present invention will be described taking a Schottky barrier diode (SBD) as an example. FIG. 1 is a cross-sectional view illustrating a structure of a SBD according to Embodiment 1, where the half of its structure is shown since its actual structure is symmetric with respect to its center P. FIGS. 2 through 5 are views illustrating steps in a manufacturing process for the SBD. FIG. 6 is a graph showing a concentration profile of p-type impurities in a junction termination extension (JTE) region after an activation annealing treatment, of the SBD according to Embodiment 1.

Now referring to FIG. 1, an $n^+$-type (first conductivity type) silicon carbide substrate 1 is provided with an $n^-$-type (first conductivity type) silicon carbide layer 2 on a surface thereof. A p-type (second conductivity type) JTE region 3 having a predetermined space thereinside is provided in the surface of the silicon carbide layer 2. The JTE region 3 can be divided into three portions, i.e., a first JTE portion 3a through a third JTE portion 3c distinguished by concentration profiles of impurities therein. On the surface of the silicon carbide layer 2, an anode electrode 4 (a first electrode) is provided across an inner part of the first JTE portion 3a, the third JTE portion 3c, and the inner exposed space of the silicon carbide layer 2. A cathode electrode 5 (a second electrode) is provided on the opposite surface of the silicon carbide substrate 1. In addition, a region immediately below the anode electrode 4 is a cell region X that acts as the diode, and a region outside the cell region X is a peripheral region Y where the JTE region 3 is formed that relaxes an electric field concentration arising at the edge of the anode electrode 4. Hence, the first JTE portion 3a and the second JTE portion 3b in the JTE region 3 contribute to the relaxation of the electric field concentration.

A manufacturing process for the SBD according to Embodiment 1 will be described with reference to FIGS. 2 through 5.

First, the $n^-$-type silicon carbide layer 2 is formed on a surface of the $n^+$-type silicon carbide substrate 1 by epitaxial crystal growth. The silicon carbide substrate 1 and the silicon carbide layer 2 constitute a silicon carbide wafer. (See FIG. 2.)

Next, a first region 7 having a predetermined space thereinside is formed selectively in the surface of the silicon carbide layer 2 by ion-implanting (indicated by Arrows A in FIG. 3) aluminum (Al) and boron (B), which are p-type impurities, using a resist 6 as a mask. After the ion implantation, the resist 6 is removed. (See FIG. 3.)

Next, the ion-implanted silicon carbide wafer is subject to an activation annealing treatment at a high temperature (for example, in an argon (Ar) atmosphere at 1,500° C. for 30 minutes), whereby the implanted ions are electrically activated and crystal defects caused by the ion implantation are also repaired at the same time. (See FIG. 4.)

The boron ion-implanted in the first region 7 diffuses into its neighboring zones in the silicon carbide layer 2 during the activation annealing treatment, whereby formed in the surface of the silicon carbide layer 2 is the JTE region 3 consisting of the first JTE portion 3a, the second JTE portion 3b, and the third JTE portion 3c. The boron diffusion during the activation annealing treatment is large in the direction along the surface plane of the silicon carbide wafer (indicated by H in FIG. 4) and small in the depthwise direction (indicated by D in FIG. 4). This is due to the crystal structure of the silicon carbide wafer, more specifically, due to the fact that since the silicon carbide wafer has the [0001] crystal plane parallel to its surface, diffusivity is large in the direction along the [0001] plane and small in the direction orthogonal thereto. It should be noted here that only boron diffuses by the activation annealing treatment and diffusion of aluminum is, in contrast, negligible small. (See FIG. 4.)

Next, after a metal film is formed on the surface of the silicon carbide layer 2 by physical vapor deposition (PVD) such as sputtering, the anode electrode 4 (the first electrode), which is a Schottky electrode, is formed by removing a portion of the metal film unnecessary therefor, i.e., the anode electrode 4 is formed on the surface of the silicon carbide layer 2 in the cell region X, in other words, the anode electrode 4 is formed arranged so as to cover a part of the first region 7 and the inner exposed space of the silicon carbide layer 2. Thus, after the annealing treatment, the anode electrode 4 is formed across the inner part of the JTE portion 3a, the third JTE portion 3c, and the inner exposed space of the silicon carbide layer 2. In addition, as a material for the anode electrode 4, for example, titanium (Ti) or nickel (Ni) is used that is able to offer a desired characteristic of the Schottky junction. (See FIG. 5.)

Finally, the cathode electrode 5 (the second electrode) is formed on the opposite surface of the silicon carbide substrate 1 by physical vapor deposition (PVD) such as sputtering. Up to this step, the main part of the SBD shown in FIG. 1 is completed.

A concentration profile of the p-type impurities in the JTE region 3 will be explained with reference to FIG. 6.

FIG. 6 shows a concentration profile of the p-type impurities in the JTE region 3 consisting of the first JTE portion 3a, the second JTE portion 3b, and the third JTE portion 3c. The first JTE portion 3a (zone I in the figure) is a region that is formed in the peripheral region Y and in the zone under the edge of the anode electrode 4 and has a p-type impurity concentration of substantially constant. The first JTE portion 3a keeps an initial p-type impurity concentration at the ion implantation, even after the activation annealing treatment. The second JTE portion 3b (zones II and III in the figure) is a region that is formed outside the first JTE portion 3a and has a p-type impurity concentration continuously decreasing from that in the first JTE portion 3a to a concentration inverting to an n-type one, outwardly along the peripheral region Y. The third JTE portion 3c is a region that is formed inside the first JTE portion 3a and has a p-type impurity concentration continuously decreases from that in the first JTE portion 3a, inwardly along the cell region X from the edge of the anode electrode 4. The concentration gradient in the second JTE portion 3b is, as has been described in the explanation of the manufacturing process, developed during the activation annealing treatment by diffusion of the boron in the vicinity of the junction of the first region 7 (zone II) toward no boron-implanted region (zone III) of the silicon carbide layer 2.

Since the third JTE portion 3c among these JTE portions 3a, 3b, and 3c is overlaid with the anode electrode 4, the third JTE portion 3c makes no contribution to relaxation of the electric field concentration arising at the edge of the anode electrode 4. Hence, portions of the JTE region 3 that contribute to relaxation of the electric field concentration are the first and second JTE portions 3a and 3b that are formed in the peripheral region Y and in the zone under the edge of the anode electrode 4.

The amounts and a ratio of boron and aluminum to be ion-implanted are adjusted so that such a concentration gradient of the p-type impurities is developed during the activation annealing treatment that the concentration in the JTE region 3 decreases from high to low, outwardly along the peripheral region Y.

For example, assuming each p-type impurity concentration of aluminum and boron in the first region 7 to be a value of 10 after the ion implantation and assuming a rate of the boron diffusing into the neighboring zones during the activation annealing treatment to be 40%, in other words, 40% of the boron in the zone II is assumed to diffuse into the zone III, a p-type impurity concentration in the zone I of the first JTE portion 3a remains 20 (=10+10) and those in the zone II and the zone III of the second JTE portion 3b become 16 (=10+6) and 4 (=+4) in average, respectively, after the activation annealing treatment. This implies that such a concentration gradient of the p-type impurities is established in the JTE region 3 that the concentration therein decreases outwardly along the peripheral region Y.

In addition, the second JTE portion 3b formed by the diffusion of the boron becomes two to four µm in width. We have confirmed by simulation that such a width is effective for relaxing the electric field concentration.

In Embodiment 1 of the invention, the first region 7 is formed in the surface of the silicon carbide layer 2 by ion-implanting aluminum and boron as p-type impurities; after that, by diffusing the boron ion-implanted in the first region 7 in the direction along the surface of the silicon carbide layer 2 by the activation annealing treatment, formed in the peripheral region Y and in the zone under the edge of the electrode 4 is the JTE region 3 in which a concentration gradient of the p-type impurities is developed such that the concentration therein decreases from high to low, outwardly along the peripheral region Y. Thereby, the JTE region 3 includes a plurality of p-type portions where the impurity concentration decreases stepwise, which allows formation of the JTE region 3 having a wide range of p-type impurity concentration and having a desired breakdown voltage by a standard activation annealing treatment after ion implantation. For that reason, there is no need for such many manufacturing steps as those in a conventional manufacturing process to form a JTE region consisting of a plurality of p-type portions in which a p-type impurity concentration decreases stepwise outwardly along the peripheral region. This streamlining of manufacturing process leads to reduction in manufacturing costs, enabling cost reduction of silicon carbide semiconductor devices.

Embodiment 2

While Embodiment 1 has been described in which the first region 7 is formed by ion implantation and then the JTE region 3 having a wide range of p-type impurity concentration is formed by the activation annealing treatment, two or more ion-implanted regions may be formed. Embodiment 2 of the invention will be described below taking an example in which two regions are formed by ion implantation.

Figure 7:
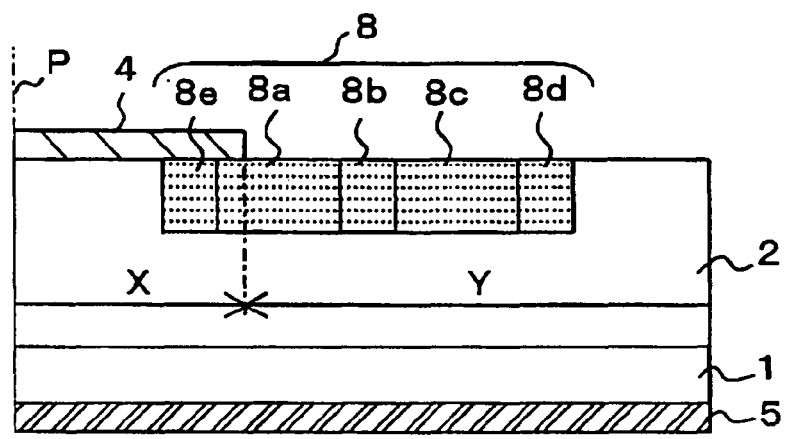
FIG. 7 is a cross-sectional view illustrating a structure of a SBD of a silicon carbide semiconductor device according to Embodiment 2 of the invention.
Figure 8:
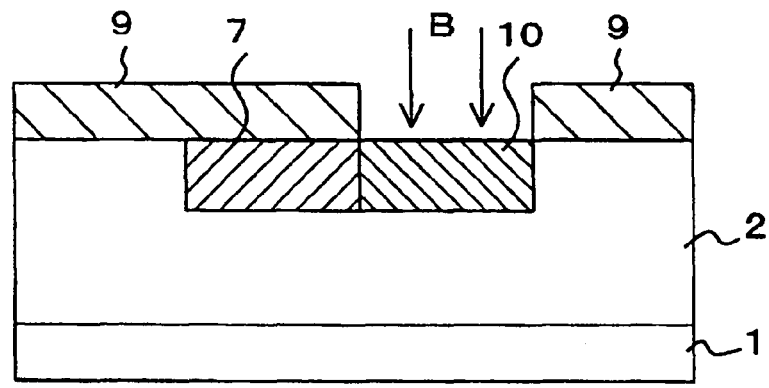
FIG. 8 is a view illustrating a step in a manufacturing process for the SBD according to Embodiment 2.
Figure 9:
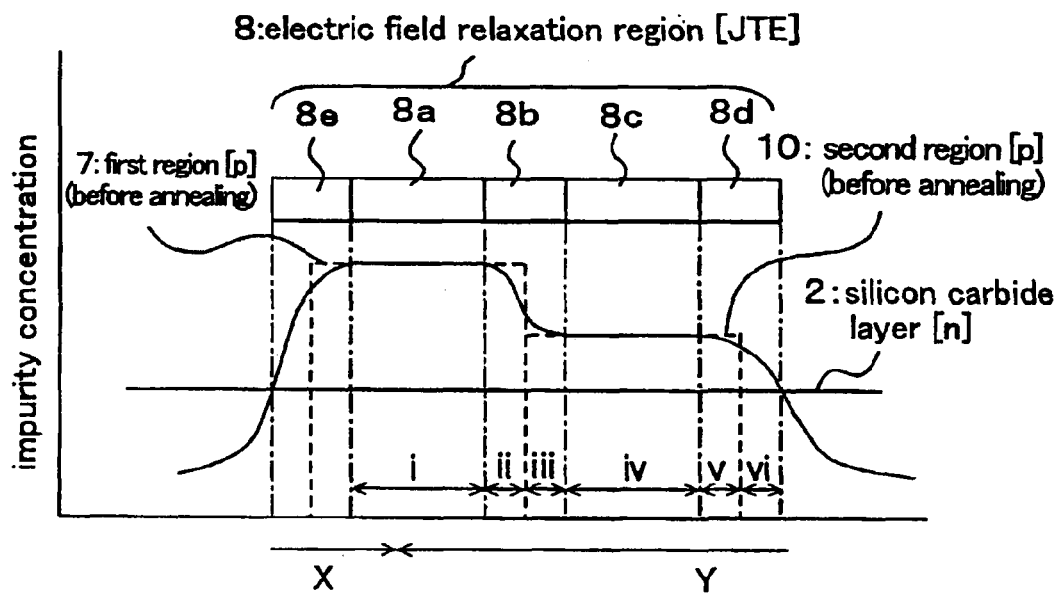
FIG. 9 is a graph illustrating a concentration profile of p-type impurities in the JTE region after an activation annealing treatment, of the SBD according to Embodiment 2.

FIG. 7 is a cross-sectional view illustrating a structure of a Schottky barrier diode (SBD) according to Embodiment 2, where the half of the SBD structure is shown since its actual structure is symmetric with respect to its center P. FIG. 8 is a view illustrating a manufacturing process for the SBD, where shown is a manufacturing step different from that in the manufacturing process for a SBD according to Embodiment 1. FIG. 9 is a graph showing a concentration profile of p-type impurities in a JTE region after an activation annealing treatment, of the SBD according to Embodiment 2. Note that in FIGS. 7 to 9, the same reference numerals as in FIG. 1 of Embodiment 1 indicate elements the same as or equivalent to those in FIG. 1; hence, their explanations are omitted here.

Difference in structure from Embodiment 1 is in that a p-type (second conductivity type) JTE region 8 is provided in a surface of the silicon carbide layer 2, instead of the p-type (second conductivity type) JTE region 3. The JTE region 8 can be divided into five portions, i.e., a first JTE portion 8a through a fifth JTE portion 8e distinguished by concentration profiles of p-type impurities therein. Similarly to Embodiment 1, a region immediately below an anode electrode 4 is a cell region X that acts as the diode, and a region outside the cell region X is a peripheral region Y where the JTE region 8 is formed that relaxes an electric field concentration arising at the edge of the anode electrode 4. Hence, the first JTE portion 8a through the fourth JTE portion 8d in the JTE region 8 contribute to the relaxation of the electric field concentration.

A manufacturing process for the SBD according to Embodiment 2 will be described. Here, a step in the manufacturing process different from that explained in Embodiment 1 is described.

The manufacturing step illustrated in FIG. 8 is carried out after that of forming the first region 7 explained in Embodiment 1. Specifically, a $p^-$-type second region 10 is formed in the surface of the silicon carbide layer 2 so as to abut the outer side of the first region 7, by ion-implanting (indicated by Arrows B in FIG. 8) aluminum (Al) and boron (B), which are p-type impurities, using a resist 9 as a mask. A p-type impurity concentration in the second region 10 is adjusted lower than that in the first region 7. After the ion implantation, the resist 9 is removed.

Manufacturing steps after forming the second region 10 are almost the same as those in and after the activation annealing treatment described in Embodiment 1. Note that, in Embodiment 2, the boron ion-implanted in the first region 7 and the second region 10 diffuses, as shown in FIG. 9, into their neighboring zones in the silicon carbide layer 2 during the activation annealing treatment, whereby formed in the surface of the silicon carbide layer 2 is the JTE region 8 consisting of the first JTE portion 8a to the fifth JTE portion 8e. As has already been explained in Embodiment 1, the boron diffusion during the activation annealing treatment is large in the direction along the surface of the silicon carbide wafer and small in the depthwise direction.

A concentration profile of the p-type impurities in the JTE region 8 will be explained with reference to FIG. 9.

FIG. 9 shows a concentration profile of the p-type impurities in the JTE region 8 consisting of the first JTE portion 8a, the second JTE portion 8b, the third JTE portion 8c, the fourth JTE portion 8d, and the fifth JTE portion 8e. The first JTE portion 8a (zone i in the figure) is a region that is formed in the peripheral region Y and in the zone under the edge of the anode electrode 4 and has a p-type impurity concentration of substantially constant. The first JTE portion 8a keeps an initial p-type impurity concentration at the ion implantation, even after the activation annealing treatment. The third JTE portion 8c (zone iv in the figure) is a region that is formed next to the second JTE portion 8b outside the first JTE portion 8a and has a p-type impurity concentration of substantially constant. The third JTE portion 8c also keeps an initial p-type impurity concentration at the ion implantation, even after the activation annealing treatment. Note that the p-type impurity concentration in the third JTE portion 8c is lower than that in the first JTE portion 8a. The second JTE portion 8b is a region that is formed between the first JTE portion 8a and the third JTE portion 8c and has a p-type impurity concentration continuously decreasing from that in the first JTE portion 8a to that in the third JTE portion 8c, outwardly along the peripheral region Y. The fourth JTE portion 8d is a region that is formed outside the third JTE portion 8c and has a p-type impurity concentration decreasing continuously from that in the third JTE portion 8c to a concentration inverting to an n-type one, outwardly along the peripheral region Y. The fifth JTE portion 8e is a region that is formed inside the first JTE portion 8a and has a p-type impurity concentration continuously decreasing from that in the first JTE portion 8a, inwardly along the cell region X from the vicinity of the edge of the anode electrode 4. The concentration gradient in the second JTE portion 8b is developed during the activation annealing treatment by diffusion of the boron in the vicinity of the boundary of the first region 7 (zone ii in the figure) toward the low-boron-concentration second region 10 (zone iii in the figure). The concentration gradient in the fourth JTE portion 8d is also developed during the activation annealing treatment by diffusion of the boron in the vicinity of the junction of the second region 10 (zone v in the figure) toward no boron-implanted region (zone vi in the figure) in the silicon carbide layer 2.

Since the fifth JTE portion 8e among these JTE portions 8a through 8e, is overlaid with the anode electrode 4, the fifth JTE portion 3e makes no contribution to relaxation of the electric field concentration arising at the edge of the anode electrode 4. Hence, portions of the JTE region 8 that contribute to relaxation of the electric field concentration are the first JTE portion 8a to the fourth JTE portion 8d that are formed in the peripheral region Y and in the zone under the edge of the anode electrode 4.

The amounts and ratios of boron and aluminum to be ion-implanted are adjusted so that such a concentration gradient of the p-type impurities is developed during the activation annealing treatment that the concentration in the JTE region 8 decreases from high to low, outwardly along the peripheral region Y.

For example, assuming each p-type impurity concentration of aluminum and boron in the first region 7 and in the region 10 to be values of 10 and 5, respectively, after the ion implantation and assuming a rate of the boron diffusing into their neighboring zones during the activation annealing treatment to be 40% as is the case with Embodiment 1, a p-type impurity concentration in the zone i of the first JTE portion 8a remains 20 (=10+10), those in the zone ii and the zone iii of the second JTE portion 8b become 18 (=10+(10−2)) and 12 (=5+(5+2)) in average, respectively, those in the zone iv of the third JTE portion 8c remains 10 (=5+5), and that in the zone v and the zone vi of the second JTE portion 8d become 8 (=5+3) and 2 (=0+2) in average, respectively, after the activation annealing treatment. This implies that such a concentration gradient of the p-type impurity concentration is established in the JTE region 8 that the concentration therein decreases outwardly along the peripheral region Y.

In addition, the second JTE portion 8b and the fourth JTE portion 8d formed by the diffusion of the boron each become two to four μm in width. This width can exhibit an effect sufficient for relaxing the electric field concentration, as is the case with two to four μm described in Embodiment 1.

In Embodiment 2 of the invention, by ion-implanting aluminum and boron as p-type impurities in the surface of the silicon carbide layer 2, the first region 7 having a predetermined space thereinside is formed and the second region 10 is formed thereoutside with its p-type impurity concentration lower than that in the first region 7; after that, by diffusing the boron ion-implanted in the first region 7 and the second region 10 in the direction along the surface of the silicon carbide layer 2 by the activation annealing treatment, formed in the peripheral region Y and in the zone under the edge of the anode electrode 4 is the JTE region 8 in which a concentration gradient of the p-type impurities is developed such that the concentration in the JTE region 8 decreases from high to low, outwardly along the peripheral region Y. Thereby, the JTE region 8 includes a plurality of p-type portions where the impurity concentration decreases stepwise, which allows formation of the JTE region 8 having a wide range of p-type impurity concentration and having a desired breakdown voltage by a standard activation annealing treatment after ion implantation. For that reason, there is no need for such many manufacturing steps as those in a conventional manufacturing process to form a JTE region consisting of a plurality of p-type portions in which a p-type impurity concentration decreases stepwise outwardly along the peripheral region. This streamlining of manufacturing process leads to reduction in manufacturing costs, enabling cost reduction of silicon carbide semiconductor devices.

While Embodiment 2 has been described taking an example in which two ion-implanted regions are provided to form a JTE region by an activation annealing treatment, more than two ion-implanted regions may be provided to form a JTE region. Similarly to Embodiment 2, forming a plurality of ion-implanted regions where the p-type impurity concentration decreases stepwise outwardly along the peripheral region and then treating the ion-implanted regions by an activation annealing, a JTE region can be formed in the peripheral region Y and in the zone under the edge of the anode electrode 4, in which a concentration gradient of the p-type impurities is developed such that the concentration in the JTE region decreases from high to low, outwardly along the peripheral region. The JTE region, since it includes a plurality of p-type portions having a wide range of p-type impurity concentration that decreases stepwise, can be designed to have a desired breakdown voltage.

Embodiment 3

In Embodiment 2, since boron and aluminum are ion-implanted as p-type impurities to form the first region 7, the fifth JTE portion 8e unnecessary for the JTE region 8 is inevitably formed inside the first portion 8a by the activation annealing treatment. The fifth JTE portion 8e reduces the effective area (Schottky junction area) of the anode electrode 4, which would result in increase of power loss during operation.

In Embodiment 3 of the invention, in order to prevent the formation of the fifth JTE portion 8e shown in Embodiment 2, only aluminum is ion-implanted to form a first region 7. Other manufacturing steps are the same as those described in Embodiment 2. Thus, since no boron diffuses into the neighboring zones of a first region 7 during an activation annealing treatment, a fifth JTE portion 8e and a second JTE portion 8b are not formed.

Figure 10:
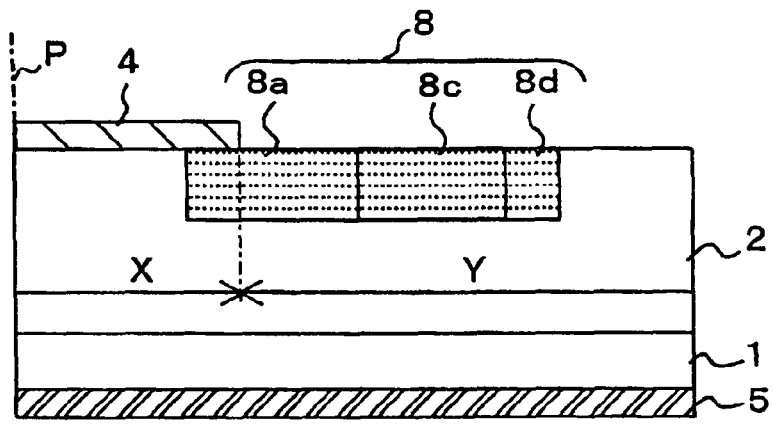
FIG. 10 is a cross-sectional view illustrating a structure of a SBD of a silicon carbide semiconductor device according to Embodiment 3 of the invention.
Figure 11:
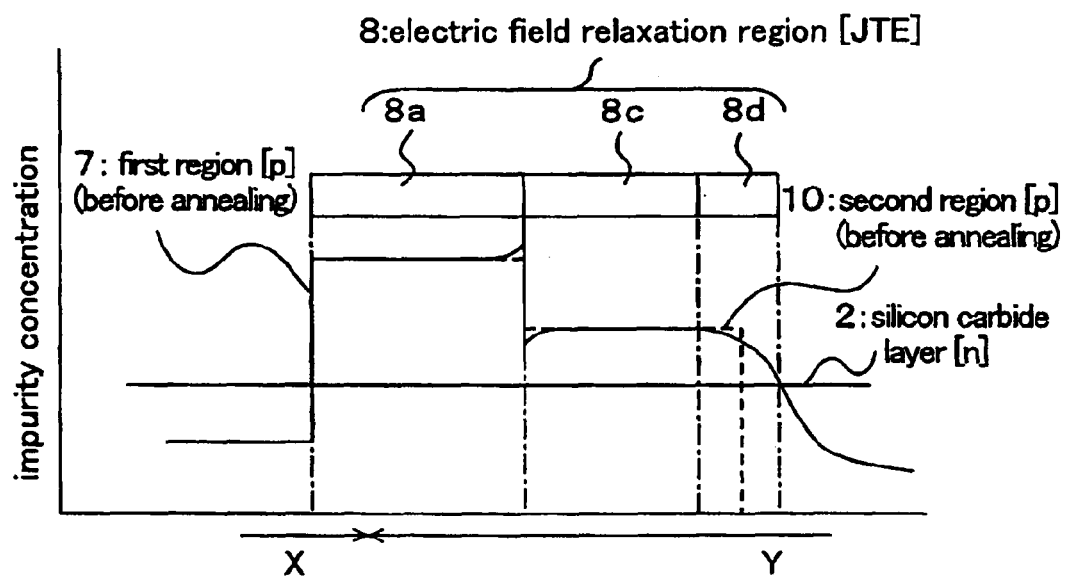
FIG. 11 is a graph illustrating a concentration profile of p-type impurities in the JTE region after an activation annealing treatment, of the SBD according to Embodiment 3.

FIG. 10 is a cross-sectional view illustrating a structure of a Schottky barrier diode (SBD) according to Embodiment 3, where the half of the SBD structure is shown since its actual structure is symmetric with respect to its center P. FIG. 10 differs from FIG. 7 of Embodiment 2 in that there are no second JTE portion 8b and no fifth JTE portion 8e that is to be formed inside the first JTE portion 8a in the cell region X. Others are essentially the same as those in FIG. 7; hence, used in FIG. 10 are the same reference numerals as in FIG. 7 and their detail descriptions are omitted. FIG. 11 is a graph showing a concentration profile of p-type impurities in a JTE region 8 after an activation annealing treatment, of the SBD according to Embodiment 3. Similarly, FIG. 11 differs from FIG. 9 of Embodiment 2 in that there are no fifth JTE portion 8e and no second JTE portion 8b, and others are the same as those shown in FIG. 9. As to a manufacturing process according to Embodiment 3, it is also almost the same as that explained in Embodiment 2; hence, its explanation is omitted here.

In Embodiment 3, the JTE region 8 is formed in the peripheral region Y and in the zone under the edge of an anode electrode 4, as with Embodiment 2, in which a concentration gradient of p-type impurities is developed such that the concentration in the JTE region 8 decreases from high to low outwardly along the peripheral region Y. Hence, without the second JTE portion 8b, the JTE region 8 includes a plurality of p-type portions where the impurity concentration decreases stepwise, which allows the JTE region 8 to have a desired breakdown voltage. Moreover, there is no need for such many manufacturing steps, similarly to Embodiment 2, as compared to those in a conventional manufacturing process. Furthermore, in Embodiment 3, the fifth JTE portion 8e is not formed inside the first JTE portion 8a in the cell region X, so that the effective area of the anode electrode 4 is not reduced, preventing increase in power loss during operation.

Embodiment 4

While a JTE region formed in a Schottky barrier diode of a silicon carbide semiconductor device has been described in Embodiment 1 through Embodiment 3, the JTE-region manufacturing processes described above can be applied to other silicon carbide semiconductor devices. In Embodiment 4 of the invention, a manufacturing process for another silicon carbide semiconductor device will be described taking a PN diode as an example.

Figure 12:
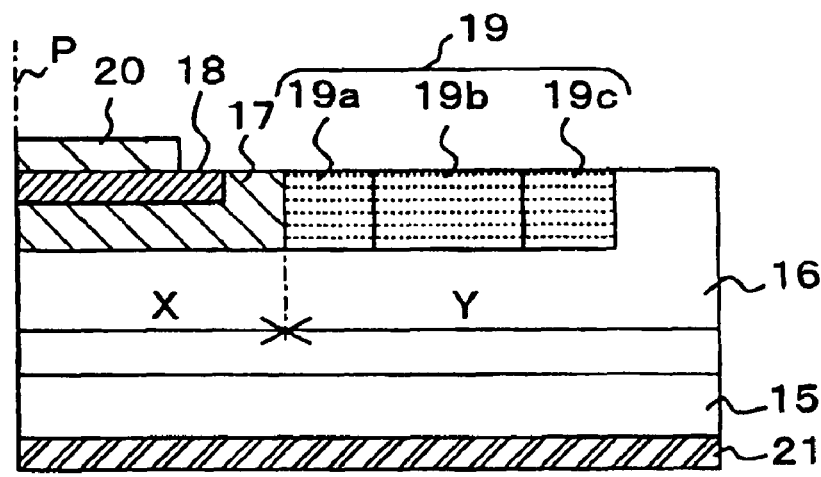
FIG. 12 is a cross-sectional view illustrating a structure of a PN diode of a silicon carbide semiconductor device according to Embodiment 4 of the invention.
Figure 13:
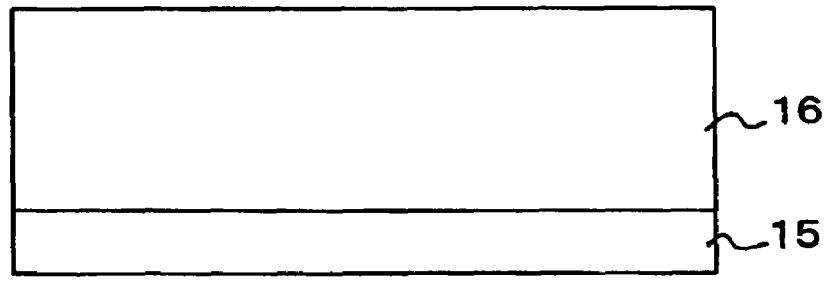
FIGS. 13 to 18 are views illustrating steps in the manufacturing process for the PN diode according to Embodiment 4.
Figure 14:
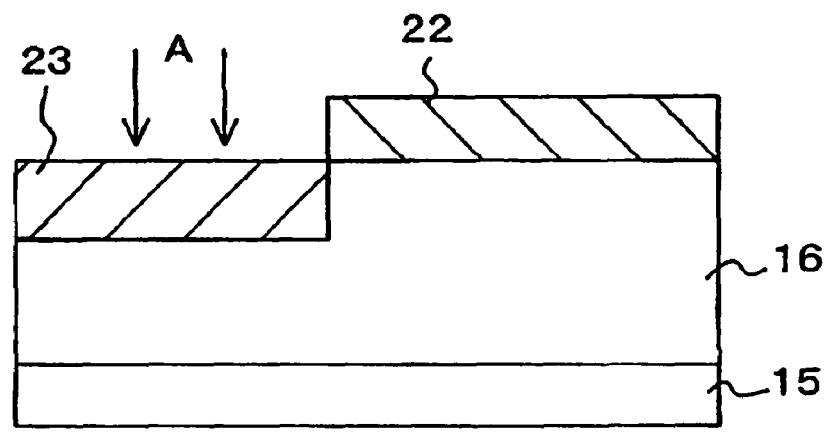
Figure 15:
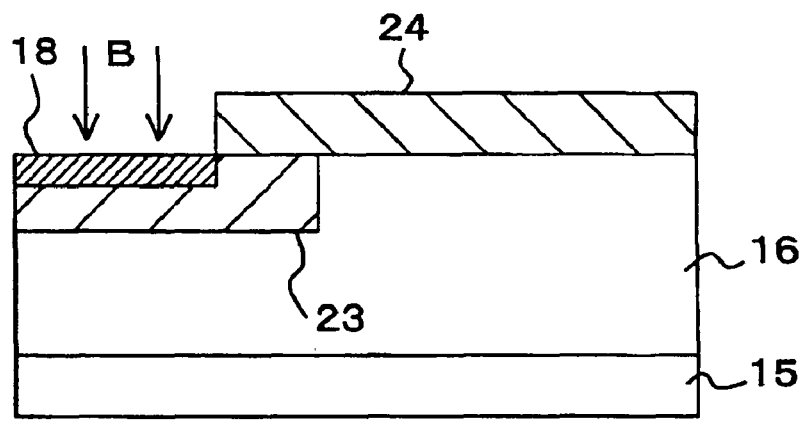
Figure 16:
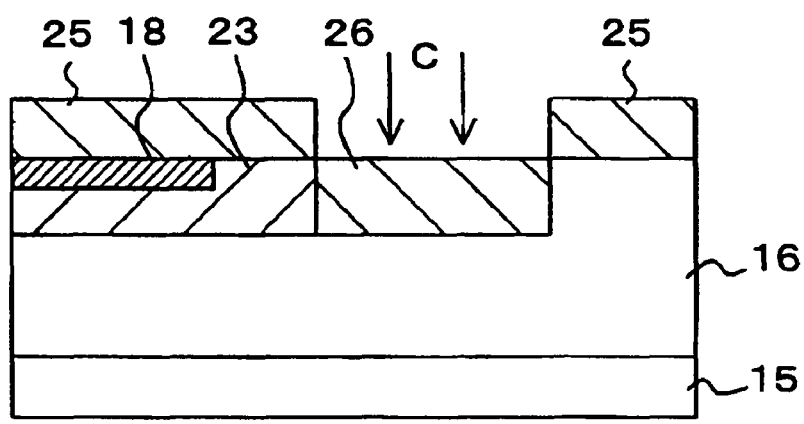
Figure 17:
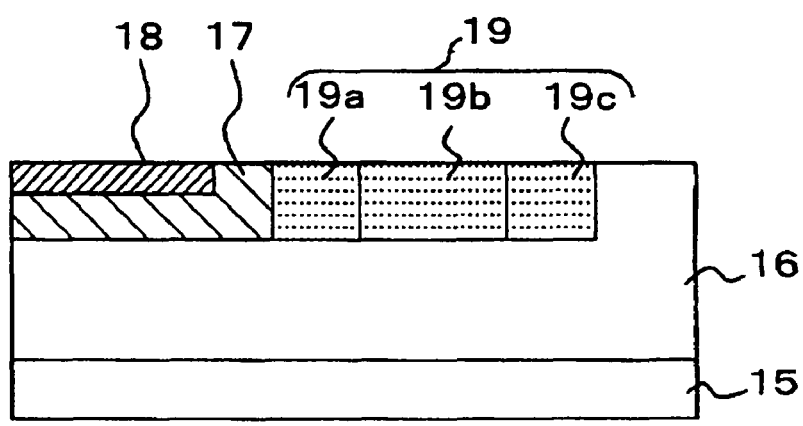
Figure 18:
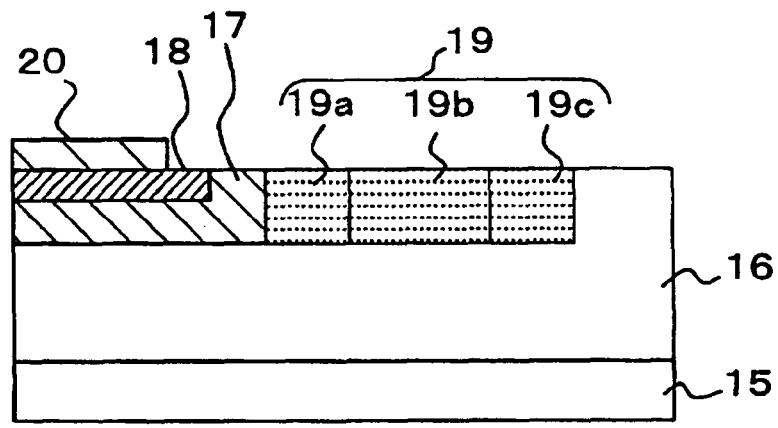
Figure 19:
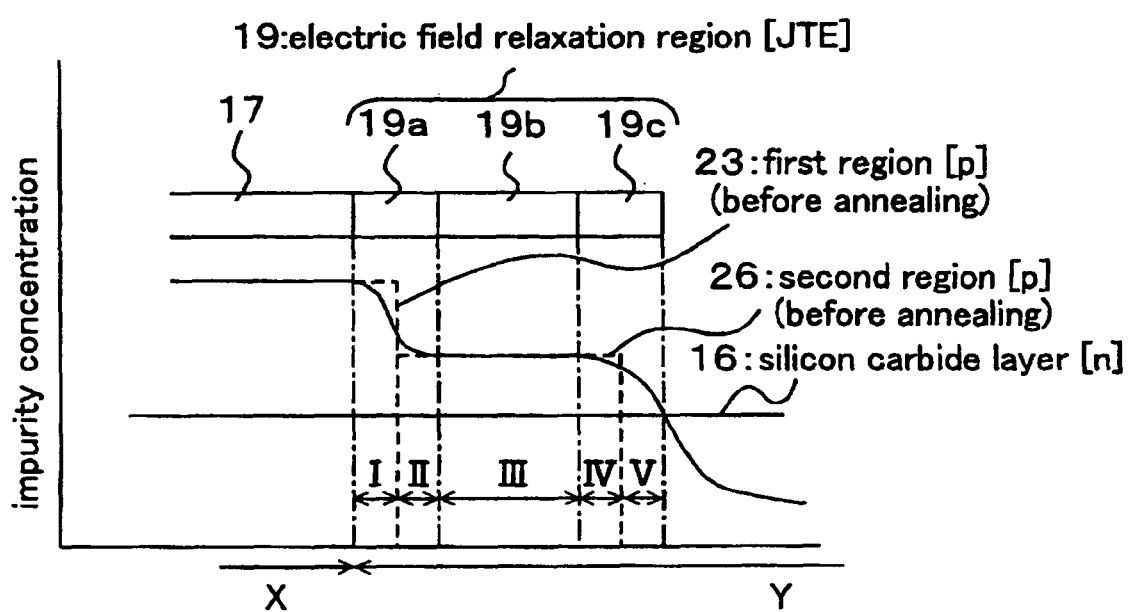
FIG. 19 is a graph illustrating a concentration profile of p-type impurities in the JTE region after an activation annealing treatment, of the PN diode according to Embodiment 4.

FIG. 12 is a cross-sectional view illustrating a structure of a PN diode according to Embodiment 4, where the half of the PN diode structure is shown since its actual structure is symmetric with respect to its center P. FIGS. 13 through 18 are views illustrating a manufacturing process for the PN diode. FIG. 19 is a graph showing a concentration profile of p-type impurities in a JTE region after an activation annealing treatment, of the PN diode according to Embodiment 4.

Referring to FIG. 12, an $n^+$-type (first conductivity type) silicon carbide substrate 15 is provided with an $n^-$-type (first conductivity type) silicon carbide layer 16 on a surface thereof. A p-type (second conductivity type) well region 17 is provided in the surface of the silicon carbide layer 16, and a $p^+$-type (second conductivity type) contact region 18 is provided in the surface of the well region 17. In the surface of the silicon carbide layer 16, a JTE region 19 is provided outside the well region 17. The JTE region 19 can be divided into three portions, i.e., a first JTE portion 19a through a third JTE portion 19c distinguished by concentration profiles of impurities therein. Moreover, an anode electrode 20 (a first electrode) is provided on the surface of the contact region 18, and a cathode electrode 21 (a second electrode) is provided on the opposite surface of the silicon carbide substrate 15. In addition, a region where the well region 17 is formed is a cell region X that acts as the diode, and a region outside the cell region X is a peripheral region Y where the JTE region 19 is formed that relaxes an electric field concentration arising at the edge of its PN junction.

A manufacturing process for the PN diode according to Embodiment 4 will be described with reference to FIGS. 13 through 18.

First, the $n^-$-type silicon carbide layer 16 is formed on a surface of the $n^+$-type silicon carbide substrate 15 by epitaxial crystal growth. The silicon carbide substrate 15 and the silicon carbide layer 16 constitute a silicon carbide wafer. (See FIG. 13.)

Next, a p-type first region 23 is formed selectively in the surface of the silicon carbide layer 16 by ion-implanting (indicated by Arrows A in FIG. 14) aluminum (Al) and boron (B), which are p-type impurities, using a resist 22 as a mask. After the ion implantation, the resist 22 is removed. (See FIG. 14.)

Next, the $p^+$-type (second conductivity type) contact region 18 is formed selectively in the surface of the first region 23 by ion-implanting (indicated by Arrows B in FIG. 15) aluminum (Al), which is a p-type impurity, using a resist 24 as a mask. After the ion implantation, the resist 24 is removed. The forming of the contact region 18 is for reducing contact resistance between the well region 17 and the anode electrode (the first electrode) 20 that are to be electrically connected with each other. (See FIG. 15.)

Next, a $p^-$-type second region 26 is formed selectively in the surface of the silicon carbide layer 16 so as to abut the outer side of the first region 23 by ion-implanting (indicates by Arrows C in FIG. 16) aluminum (Al) and boron (B), which are p-type impurities, using a resist 25 as a mask. It should be noted that a p-type impurity concentration in the second region 26 is adjusted lower than that in the first region 23. After the ion implantation, the resist 25 is removed. (See FIG. 16.)

Next, the ion-implanted silicon carbide wafer is subject to an activation annealing treatment at a high temperature (for example, in an argon (Ar) atmosphere at 1,500° C. for 30 minutes), whereby the implanted ions are electrically activated and crystal defects caused by the ion implantation are also repaired at the same time. (See FIG. 17.)

The boron ion-implanted in the first region 23 and the second region 26 diffuses into their neighboring zones in the silicon carbide layer 16 during the activation annealing treatment, whereby formed in the surface of the silicon carbide layer 16 are the well region 17 and the JTE region 19 thereoutside that consists of the first JTE portion 19a, the second JTE portion 19b, and the third JTE portion 19c. As has already been explained in Embodiment 1, the boron diffusion during the activation annealing treatment is large in the direction along the surface of the silicon carbide wafer and small in the depthwise direction.

Next, after a metal film has been formed on the surface of the silicon carbide layer 16 by physical vapor deposition (PVD) such as sputtering, the anode electrode 20 (the first electrode) is formed by removing a portion of the metal film unnecessary therefor, i.e., the anode electrode 20 is formed on the surface of the contact region 18 in the cell region X. In addition, as a material for the anode electrode 20, for example, aluminum (Al) or nickel (Ni) is used. (See FIG. 18.)

Finally, the cathode electrode 21 (the second electrode) is formed on the opposite surface of the silicon carbide substrate 15 by physical vapor deposition (PVD) such as sputtering. Up to this step, the main part of the PN diode shown in FIG. 12 is completed.

A concentration profile of the p-type impurities in the JTE region 19 will be explained with reference to FIG. 19.

FIG. 19 shows a concentration profile of the p-type impurities in the JTE region 19 consisting of the first JTE portion 19a, the second JTE portion 19b, and the third JTE portion 19c. The first JTE portion 19a (zones I and II in the figure) is a region that is formed outside the well region 17 and has a p-type impurity concentration decreasing continuously from a p-type impurity concentration in the well region 17 to that in the second JTE portion 19b, outwardly along the peripheral region Y from the edge of the well region 17. The second JTE portion 19b (zone III in the figure) is a region that is formed outside the first JTE portion 19a and has a p-type impurity concentration of substantially constant. The second JTE portion 19b keeps an initial p-type impurity concentration at the ion implantation, even after the activation annealing treatment. The third JTE portion 19c (zones IV and V in the figure) is a region that is formed outside the second JTE portion 19b and has a p-type impurity concentration continuously decreasing outwardly along the peripheral region Y from the boundary of the second JTE portion 19b, that is, the p-type impurity concentration decreases continuously from that in the second JTE portion 19b to a concentration inverting to an n-type one. The concentration gradient in the first JTE portion 19a is developed during the activation annealing treatment by diffusion of the boron in the vicinity of the boundary (zone I) of the first region 23 toward the second region 26 (zone II) of low boron concentration. The concentration gradient in the third JTE portion 19c is also developed during the activation annealing treatment by diffusion of the boron in the vicinity of the junction (zone IV) of the first region 26 toward no boron-implanted region (zone V) of the silicon carbide layer 16.

The amounts and a ratio of boron and aluminum to be ion-implanted are adjusted so that such a concentration gradient of the p-type impurities is developed during the activation annealing treatment that the concentration in the JTE region 19 decreases from high to low, outwardly along the peripheral region Y from the edge of the well region 17.

In addition, the first JTE portion 19a and the third JTE portion 19c formed by the diffusion of the boron each become two to four μm in width. This width can exhibit an effect sufficient for relaxing the electric field concentration, as is the case with two to four μm described in Embodiment 1.

In a manufacturing process of Embodiment 4 of the invention, by ion-implanting aluminum and boron as p-type impurities in the surface of the silicon carbide layer 16, the first region 23 is formed and the second region 26 is formed thereoutside with its p-type impurity concentration lower than that in the first region 23; after that, by diffusing the boron ion-implanted in the first region 23 and the second region 26 in the direction along the surface of the silicon carbide layer 16 by the activation annealing treatment, formed are the well region 17 and the JTE region 19 thereoutside in which a concentration gradient of the p-type impurities is developed such that the concentration in the JTE region 19 decreases from high to low, outwardly along the peripheral region Y from the edge of the well region 17. Thereby, the JTE region 19 includes a plurality of p-type portions where the impurity concentration decreases stepwise, which allows formation of the JTE region 19 having a wide range of p-type impurity concentration and having a desired breakdown voltage by a standard activation annealing treatment after ion implantation. For that reason, there is no need for such many manufacturing steps as those in a conventional manufacturing process to form a JTE region consisting of a plurality of p-type portions in which a p-type impurity concentration decreases stepwise outwardly along the peripheral region. This streamlining of manufacturing process lead to reduction in manufacturing costs, enabling cost reduction of silicon carbide semiconductor devices.

Embodiment 5

In Embodiment 4, the first region 23 is formed by ion-implanting boron and aluminum as p-type impurities and then the well region 17 is formed by the activation annealing treatment. In Embodiment 5 of the invention, only aluminum is ion-implanted to form a first region 23 and then a well region 17 is formed by an activation annealing treatment. Other manufacturing steps are the same as those described in Embodiment 4.

Figure 20:
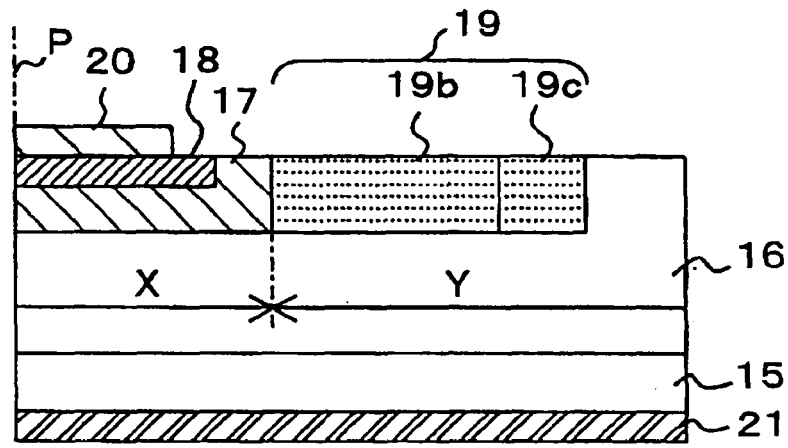
FIG. 20 is a cross-sectional view illustrating a structure of a PN diode of a silicon carbide semiconductor device according to Embodiment 5 of the invention.

FIG. 20 is a cross-sectional view illustrating a structure of a PN diode according to Embodiment 5, where the half of the PN diode structure is shown since its actual structure is symmetric with respect to its center P. The structure is essentially the same as that shown in FIG. 12 of Embodiment 4, except for a first JTE portion 19a not being formed; hence, used in FIG. 20 are the same reference numerals as in FIG. 12 and their detail descriptions are omitted. In addition, specific manufacturing steps for the PN diode are almost the same as those described in Embodiment 4; hence, their explanations are also omitted here.

In Embodiment 5, a JTE region 19 is formed, as with Embodiment 4, in which a concentration gradient of p-type impurities is developed such that the concentration in the JTE region 19 decreases from high to low, outwardly along the peripheral region Y from the edge of the well region 17. Without the first JTE portion 19a, the JTE region 19 includes a plurality of p-type portions in which the impurity concentration decreases stepwise, which allows the JTE region to have a desired breakdown voltage. Moreover, as with Embodiment 4, there is no need for such many manufacturing steps as compared to those in a conventional manufacturing process. Furthermore, since no boron is ion-implanted in the well region 17, it is possible to prevent the PN diode from deterioration in its device characteristics due to the deep impurity levels and increase in resistance in the well region.

Figure 21:
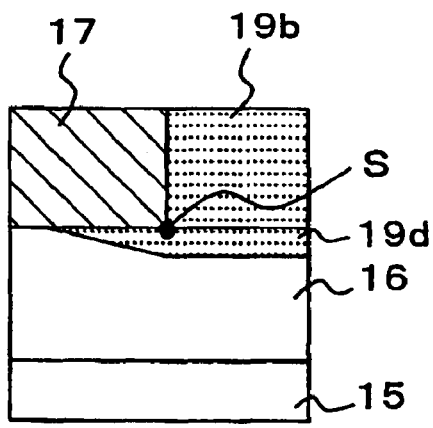
FIG. 21 is a cross-sectional view showing a part of the PN diode according to Embodiment 5.
Figure 22:
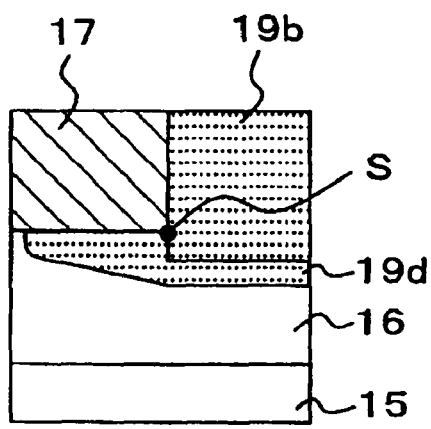
FIG. 22 is a cross-sectional view showing a part of another PN diode according to Embodiment 5.

In addition, in Embodiment 5, if a second region 26 is ion-implanted with boron deeper than or equal to the first region 23, a fourth JTE portion 19d is formed, as shown in FIGS. 21 and 22, so as to underlie the outer edge of the well region 17 (indicated by S in FIGS. 21 and 22) by slight diffusion of the boron in the depthwise direction of the silicon carbide wafer during the activation annealing treatment. The fourth JTE portion 19d exhibits an effect of relaxing the electric field concentration arising at the lower outer edge S of the well region 17.

Embodiment 6

While Embodiment 4 has been described in which the first region 23 and the second region 26 are formed by ion implantation and then the JTE region 19 having a wide range of p-type impurity concentration is formed by the activation annealing treatment, three or more ion-implanted regions may be formed. Embodiment 6 of the invention will be described below in which three regions are formed by ion implantation.

Figure 23:
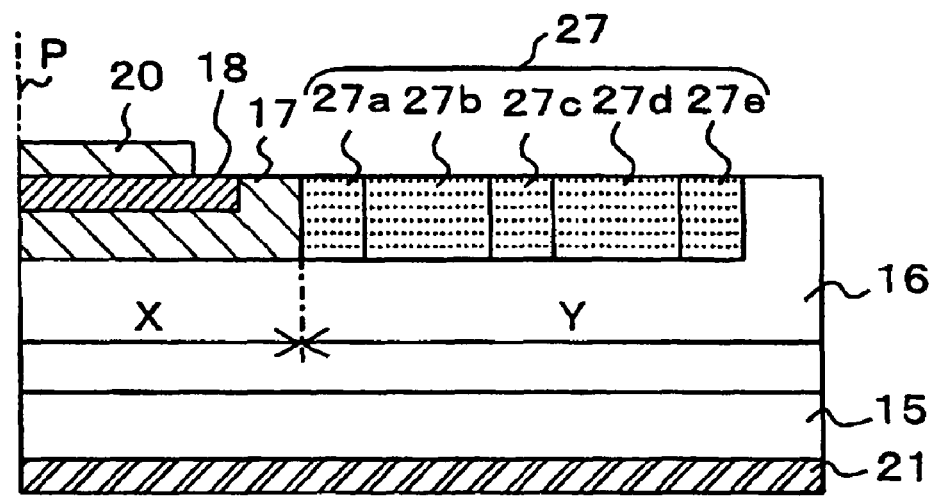
FIG. 23 is a cross-sectional view illustrating a structure of a PN diode of a silicon carbide semiconductor device according to Embodiment 6 of the invention.
Figure 24:
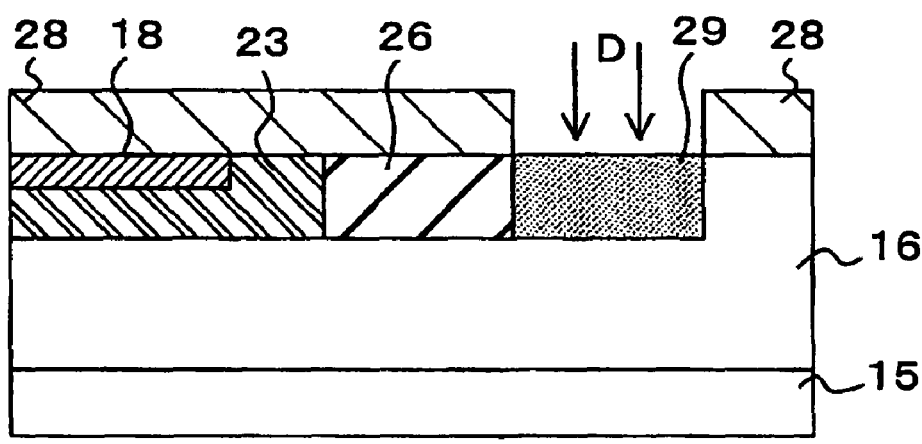
FIG. 24 is a view illustrating a step in a manufacturing process for the PN diode according to Embodiment 6.
Figure 25:
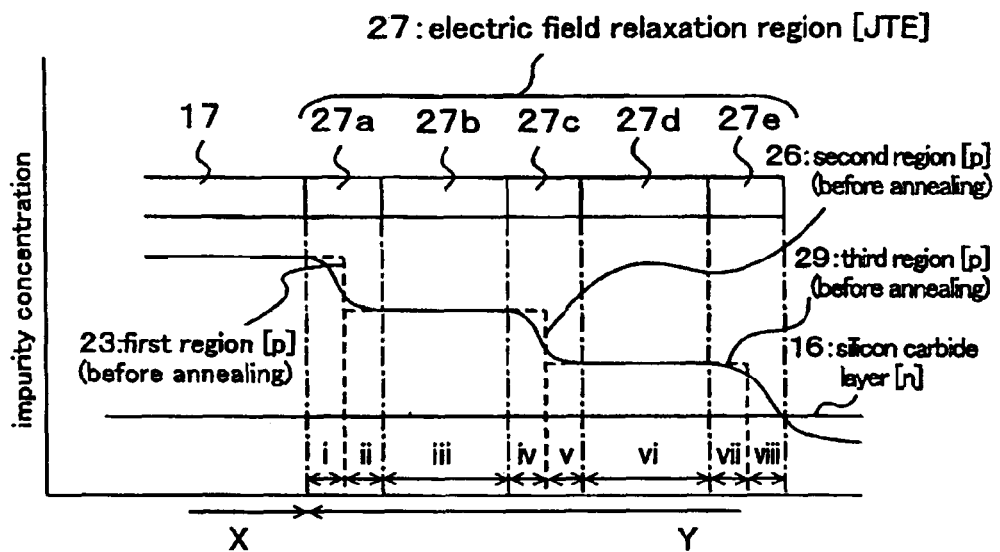
FIG. 25 is a graph illustrating a concentration profile of p-type impurities in the JTE region after an activation annealing treatment, of the PN diode according to Embodiment 6.

FIG. 23 is a cross-sectional view illustrating a structure of a PN diode according to Embodiment 6, where the half of the PN diode structure is shown since its actual structure is symmetric with respect to its center P. FIG. 24 is a view illustrating a manufacturing process for the PN diode, where shown is a manufacturing step different from that in the manufacturing process for a PN diode according to Embodiment 4. FIG. 25 is a graph showing a concentration profile of p-type impurities in a JTE region after an activation annealing treatment, of the PN diode according to Embodiment 6. Note that in FIGS. 23 to 25, the same reference numerals as in FIG. 12 of Embodiment 4 indicate elements the same as or equivalent to those in FIG. 12; hence, their explanations are omitted here.

Difference in structure from Embodiment 4 is in that a p⁻-type (secondary conductivity type) JTE region 27 is provided in the surface of the silicon carbide layer 16, instead of the p⁻-type (second conductivity type) JTE region 19. The JTE region 27 can be divided into five portions, i.e., a first JTE portion 27a through a fifth JTE portion 27e distinguished by concentration profiles of p-type impurities therein. Similarly to Embodiment 4, a region where a well region 17 is formed is a cell region X that acts as the diode, and a region outside the cell region X is a peripheral region Y where the JTE region 27 is formed that relaxes an electric field concentration arising at the edge of its PN junction.

A manufacturing process for the PN diode according to Embodiment 6 will be described. Here, a step in the manufacturing process different from that explained in Embodiment 4 is described.

The manufacturing step illustrated in FIG. 24 is carried out after that of forming the second region 26 explained in Embodiment 4. Specifically, a third region 29 of p⁻-type is formed in the surface of the silicon carbide layer 16 so as to abut the outer side of the second region 26 by ion-implanting (indicated by Arrows D in FIG. 24) aluminum (Al) and boron (B), which are p-type impurities, using a resist 28 as a mask. A p-type impurity concentration in the third region 29 is adjusted lower than that in the second region 26. After the ion implantation, the resist 28 is removed.

Manufacturing steps after forming the third region 29 are almost the same as those in and after the activation annealing treatment described in Embodiment 4. Note that, in Embodiment 6, the boron ion-implanted in the first region 23, the second region 26, and the third region 29 diffuses, as shown in FIG. 23, into their neighboring zones in the silicon carbide layer 16 during the activation annealing treatment, whereby formed in the surface of the silicon carbide layer 16 is the JTE region 27 consisting of the first JTE portion 27a to the fifth JTE portion 27e and the region inside the first JTE portion 27a becomes the well region 17.

A concentration profile of the p-type impurities in the JTE region 27 will be explained with reference to FIG. 25.

FIG. 25 shows a concentration profile of the p-type impurities in the JTE region 27 consisting of the first JTE portion 27a, the second JTE portion 27b, the third JTE portion 27c, the fourth JTE portion 27d, and the fifth JTE portion 27e. The first JTE portion 27a (zones i and ii in the figure) is a region that is formed outside the well region 17 in the peripheral region Y and has a p-type impurity concentration continuously decreasing from a p-type impurity concentration in the well region 17 to that in the second JTE portion 27b, outwardly along the peripheral region Y from the edge of the well region 17. The second JTE portion 27b (zone iii in the figure) is a region that is formed outside the first JTE portion 27a and has a p-type impurity concentration of substantially constant. The second JTE portion 27b keeps an initial p-type impurity concentration at the ion implantation, even after the activation annealing treatment. The third JTE portion 27c (zones iv and v in the figure) is a region that is formed outside the second JTE portion 27b in the peripheral region Y and has a p-type impurity concentration continuously decreasing outwardly along the peripheral region Y from the boundary of the second JTE portion 27b, that is, continuously decreasing from the p-type impurity concentration in the second JTE portion 27b to that in the fourth JTE portion 27d. The fourth JTE portion 27d (zone vi in the figure) is a region that is formed outside the third JTE portion 27c and has a p-type impurity concentration of substantially constant. The fourth JTE portion 27d also keeps an initial p-type impurity concentration at the ion implantation, even after the activation annealing treatment. The fifth JTE portion 27e (zones vii and viii in the figure) is a region that is formed outside the fourth JTE region 27d in the peripheral region Y and has a p-type impurity concentration continuously decreasing from that in the fourth JTE portion 27d to a concentration inverting to an n-type one, outwardly along the peripheral region Y from the boundary of the fourth JTE portion 27d. The concentration gradient in the first JTE portion 27a is developed during the activation annealing treatment by diffusion of the boron in the vicinity of the boundary of the first region 23 (zone i in the figure) toward the low-boron-concentration second region 26 (zone ii in the figure). The concentration gradient in the third JTE portion 27c is also developed during the activation annealing treatment by diffusion of the boron in the vicinity of the boundary of the second region 26 (zone iv in the figure) toward the low-boron-concentration third region 29 (zone v in the figure). Similarly, the concentration gradient in the fifth JTE portion 27e is developed during the activation annealing treatment by diffusion of the boron in the vicinity of the junction of the third portion 29 (zone vii in the figure) toward no boron-implanted region (zone viii in the figure) in the silicon carbide layer 16.

The amounts and ratios of boron and aluminum to be ion-implanted are adjusted so that such a concentration gradient of the p-type impurities is developed during the activation annealing treatment that the concentration in the JTE region 27 decreases from high to low, outwardly along the peripheral region Y from the edge of the well region 17.

In addition, the first JTE portion 27a, the third JTE portion 27c, and the fifth JTE portion 27e formed by the diffusion of the boron each become two to four μm in width. This width can exhibit an effect sufficient for relaxing the electric field concentration, as is the case with two to four μm described in Embodiment 1.

In the manufacturing process according to Embodiment 6 of the invention, by ion-implanting aluminum and boron as p-type impurities in the surface of the silicon carbide layer 16, the first region 23 is formed, the second region 26 is formed thereoutside with its p-type impurity concentration lower than that in the first region 23, and the third region 29 is further formed thereoutside with its p-type impurity concentration lower than that in the second region 26; after that, by diffusing the boron ion-implanted in the first region 23, the second region 26, and the third region 29 in the direction along the surface of the silicon carbide layer 16 by the activation annealing treatment, formed are the well region 17 and the JTE region 27 thereoutside in which a concentration gradient of the p-type impurities is developed such that the concentration in the JTE region 27 decreases from high to low, outwardly along the peripheral region Y from the edge of the well region 17. Thereby, the JTE region 27 includes a plurality of p-type portions where the impurity concentration decreases stepwise, which allows formation of the JTE region 27 having a wide range of p-type impurity concentration and having a desired breakdown voltage by a standard activation annealing treatment after ion implantation. For that reason, there is no need for such many manufacturing steps as those in a conventional manufacturing process to form a JTE region consisting of a plurality of p-type portions in which a p-type impurity concentration decreases stepwise outwardly along the peripheral region. This streamlining of manufacturing process lead to reduction in manufacturing costs, enabling cost reduction of silicon carbide semiconductor devices.

While Embodiment 6 has been described taking an example in which three ion-implanted regions are provided to form a JTE region by an activation annealing treatment, more than three ion-implanted regions may be provided to form a JTE region. Similarly to Embodiment 6, forming a plurality of ion-implanted regions where the p-type impurity concentration decreases stepwise outwardly along the peripheral region and then treating the ion-implanted regions by an activation annealing, a JTE region can be formed in which a concentration gradient of the p-type impurities is developed such that the concentration therein decreases from high to low, outwardly along the peripheral region Y from the edge of the well region 17. The JTE region, since it includes a plurality of p-type portions having a wide range of p-type impurity concentration that decrease stepwise, can be designed to have a desired breakdown voltage.

Embodiment 7

While in Embodiment 6, the first region 23 is formed by ion-implanting boron and aluminum as p-type impurities and then the well region 17 is formed by the activation annealing treatment, only aluminum may be ion-implanted, as is the case with Embodiment 5, to form a first region 23 and then a well region 17 is formed by an activation annealing treatment. Other manufacturing steps are the same as those described in Embodiment 6.

Figure 26:
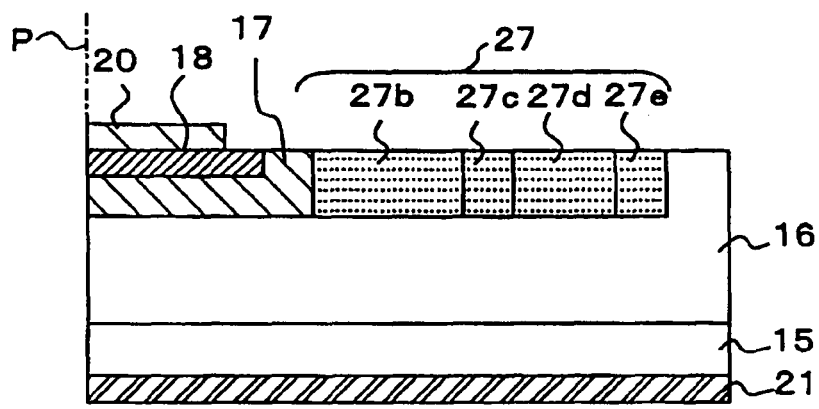
FIG. 26 is a cross-sectional view illustrating a structure of a PN diode of a silicon carbide semiconductor device according to Embodiment 7 of the invention.

FIG. 26 is a cross-sectional view illustrating a structure of a PN diode according to Embodiment 7 of the invention, where the half of the PN diode structure is shown since its actual structure is symmetric with respect to its center P. The structure is essentially the same as that shown in FIG. 23 of Embodiment 6, except for a first JTE portion 27a not being formed; hence, used in FIG. 26 are the same reference numerals as in FIG. 23 and their detail descriptions are omitted. In addition, specific manufacturing steps for the diode are almost the same as those described in Embodiment 6; hence, their explanations are also omitted here.

In Embodiment 7, a JTE region 27 is formed, as with Embodiment 6, in which a concentration gradient of p-type impurities is developed such that the concentration in the JTE region 27 decreases from high to low, outwardly along a peripheral region Y from the edge of a well region 17. Without the first JTE portion 27a, the JTE region 27 includes a plurality of p-type portions where the impurity concentration decreases stepwise, which allows the JTE region to have a desired breakdown voltage. Moreover, there is no need for such many manufacturing steps as compared to those in a conventional manufacturing process, similarly to Embodiment 6. Furthermore, since no boron is ion-implanted in the well region 17, it is possible to prevent the PN diode from deterioration in its device characteristics due to the deep impurity levels and increase in resistance in the well region.

In addition, also in Embodiment 7, if a second region 26 is ion-implanted with boron deeper than or equal to the first region 23, a p-type region (not shown) is formed so as to underlie the outer edge of the well region 17, as with the case shown in FIGS. 21 and 22, by slight diffusion of the boron in the depthwise direction of the silicon carbide wafer during an activation annealing treatment. This p-type region exhibits an effect of relaxing an electric field concentration arising at the lower outer edge of the well region 17.

Embodiment 8

JTE regions in silicon carbide semiconductor devices have been mainly described taking examples of SBDs in Embodiment 1 through Embodiment 3 and taking examples of PN diodes in Embodiment 4 through Embodiment 7. In Embodiment 8 of the invention, another JTE region will be described taking an example of a metal oxide semiconductor field effect transistor (MOSFET) as a silicon carbide semiconductor device.

Figure 27:
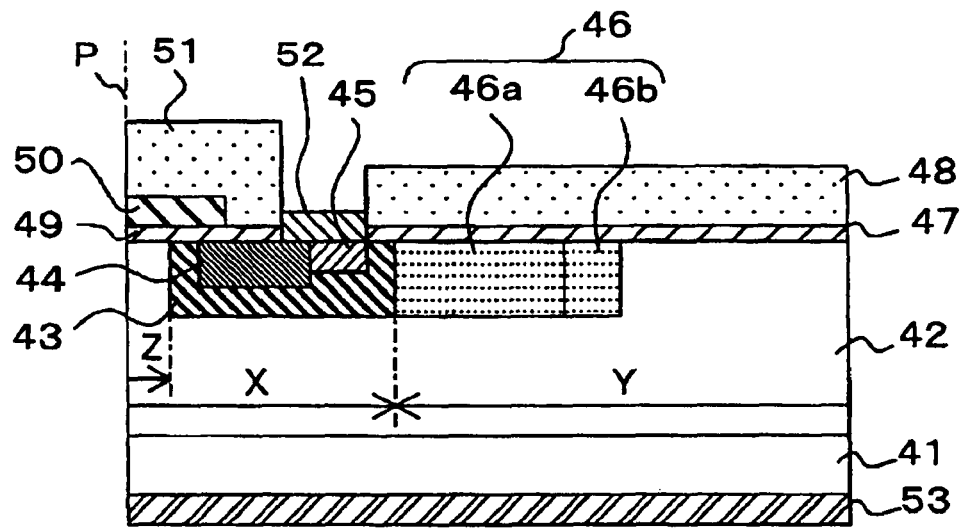
FIG. 27 is a cross-sectional view illustrating a structure of a metal oxide semiconductor field effect transistor (MOSFET) of a silicon carbide semiconductor device according to Embodiment 8 of the invention.
Figure 28:
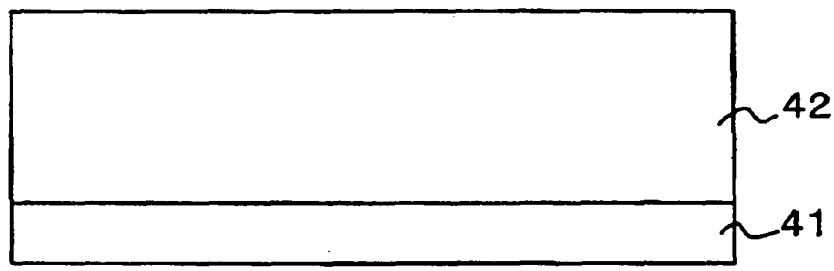
FIGS. 28 to 36 are views illustrating steps in the manufacturing process of the MOSFET according to Embodiment 8.
Figure 29:
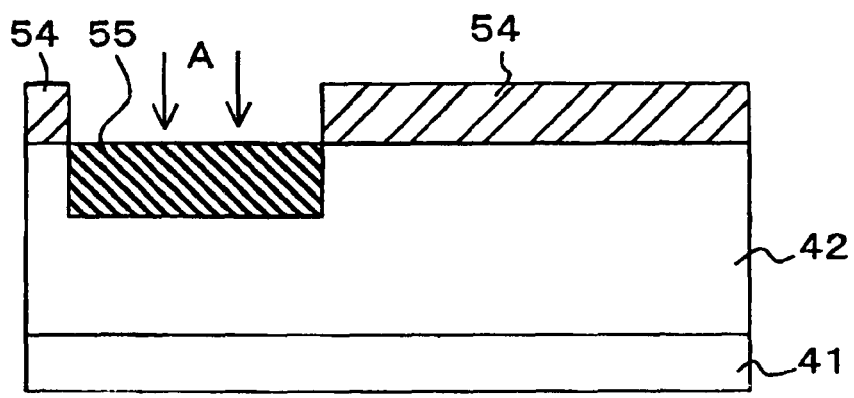
Figure 30:
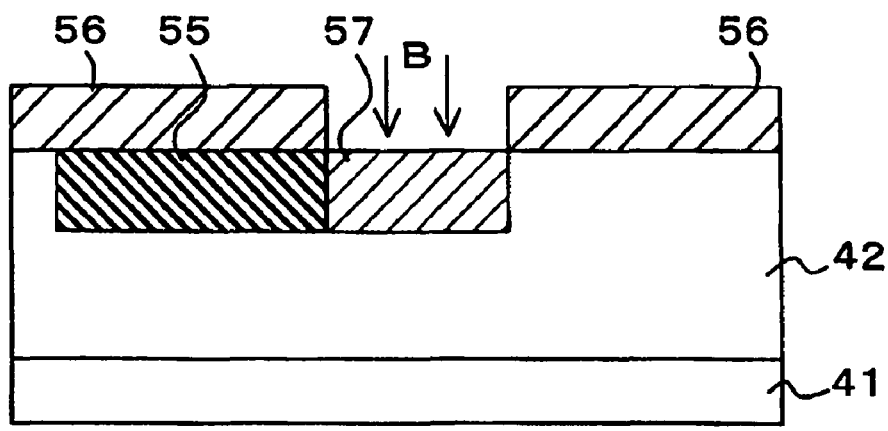
Figure 31:
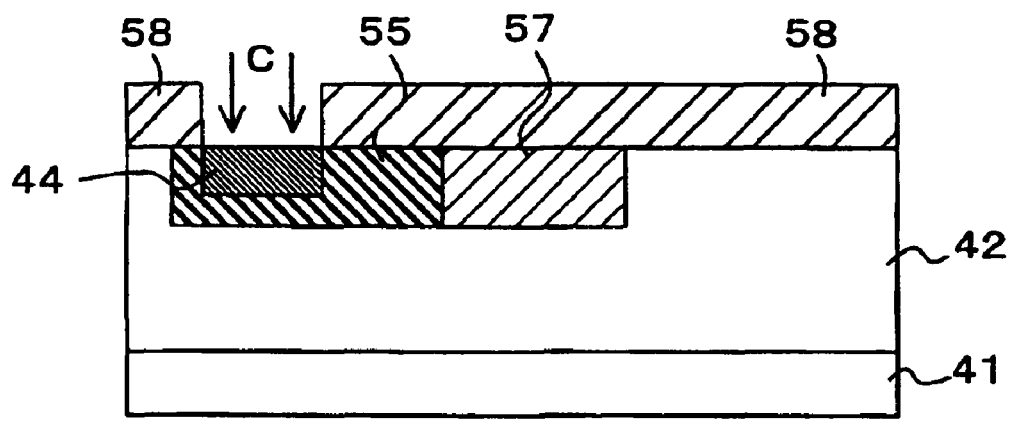
Figure 32:
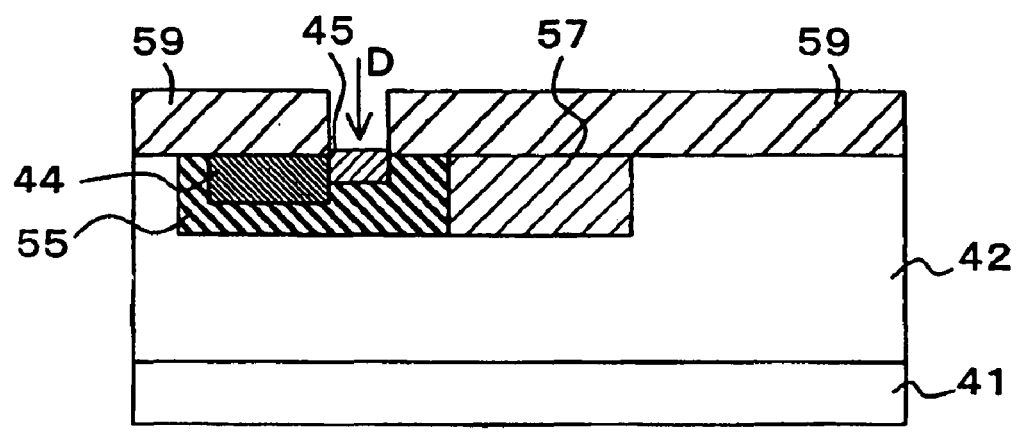
Figure 33:
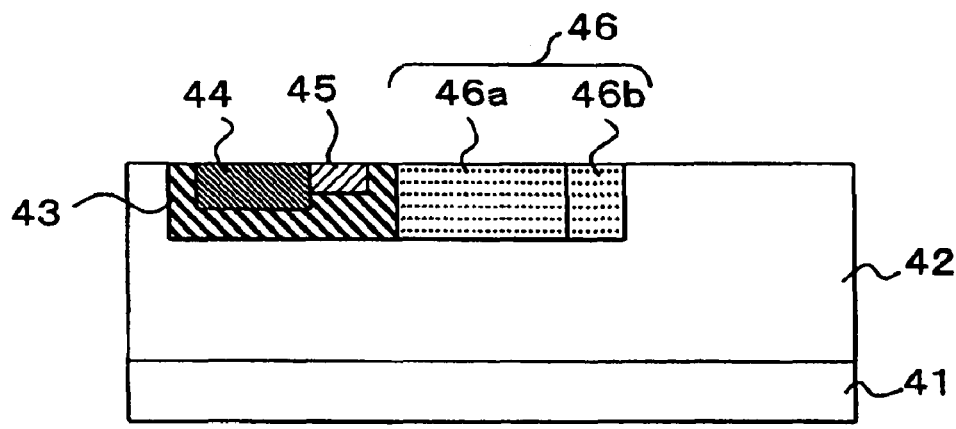
Figure 34:
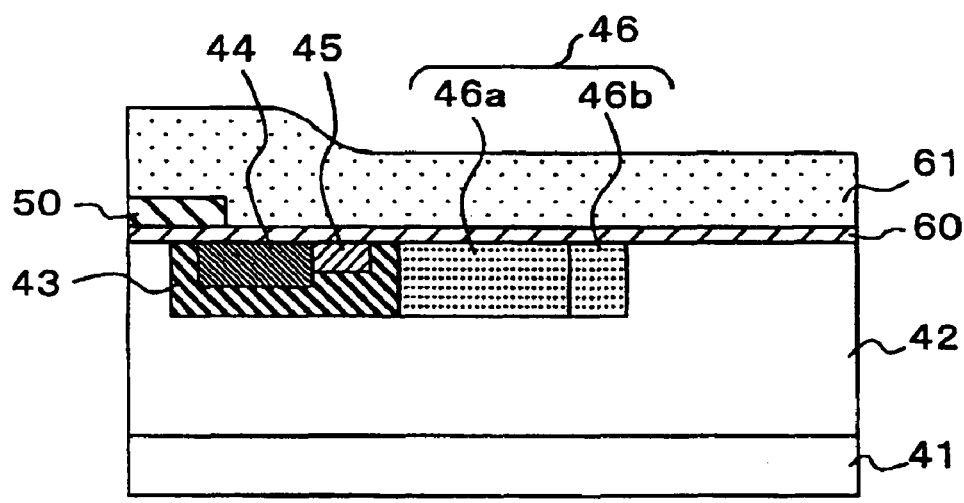
Figure 35:
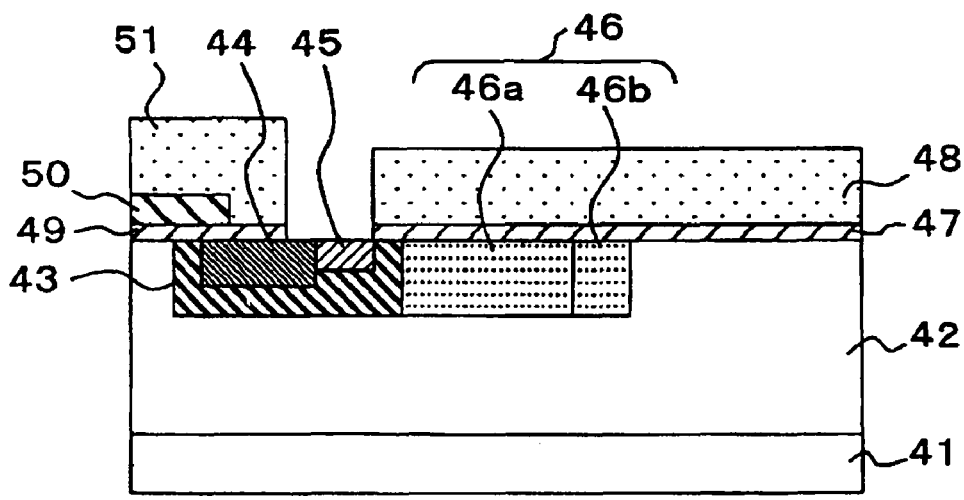
Figure 36:
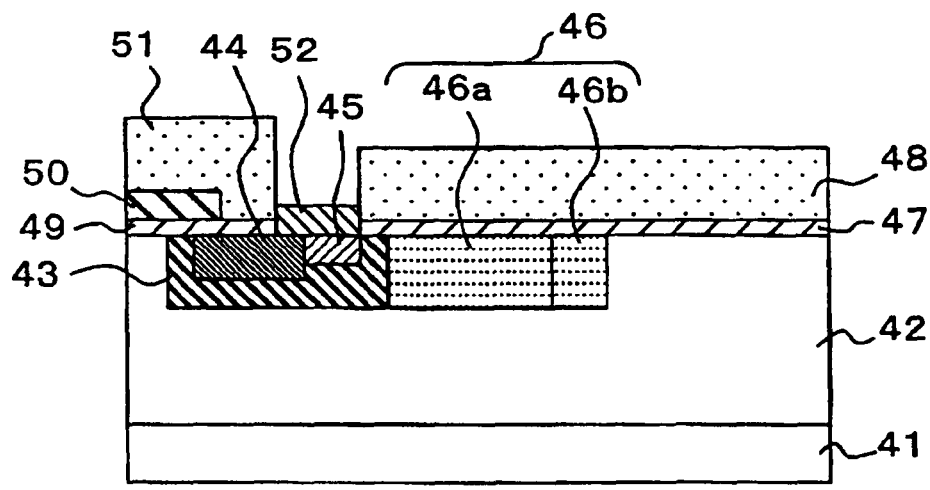
Figure 37:
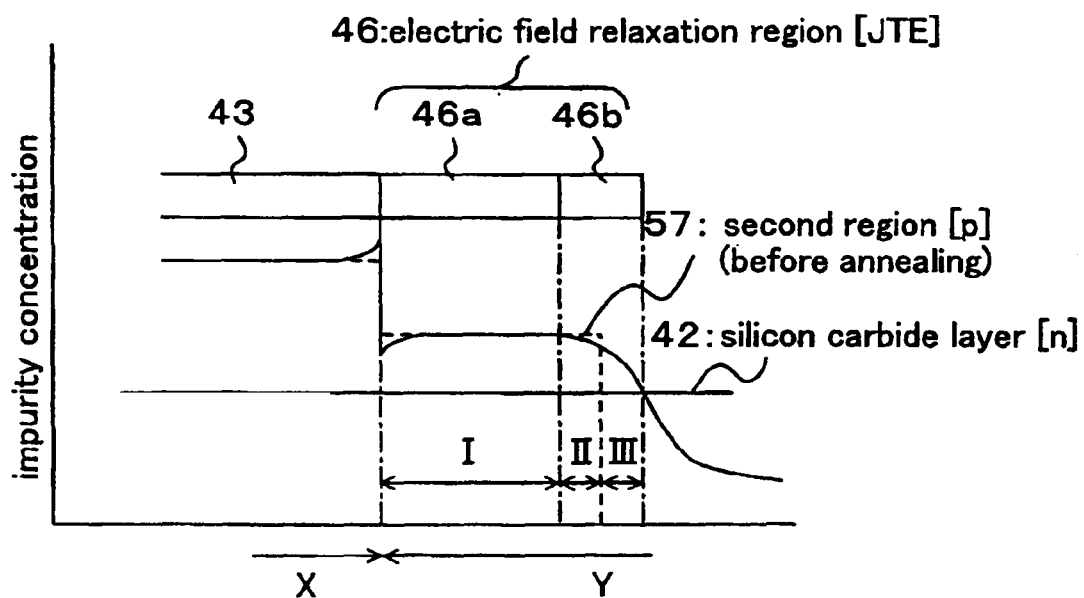
FIG. 37 is a graph illustrating a concentration profile of p-type impurities in the JTE region after an activation annealing treatment, of the MOSFET according to Embodiment 8.

FIG. 27 is a cross-sectional view illustrating a structure of a MOSFET according to Embodiment 8, where the half of the MOSFET structure is shown since its actual structure is symmetric with respect to its center P. FIGS. 28 through 36 are views illustrating steps of a manufacturing process for the MOSFET. FIG. 37 is a graph showing a concentration profile of p-type impurities in a JTE region after an activation annealing treatment, of the MOSFET according to Embodiment 8.

Referring to FIG. 27, an $n^+$-type (first conductivity type) silicon carbide substrate 41 is provided with an $n^-$-type (first conductivity type) silicon carbide layer 42 on a surface thereof. A p-type (second conductivity type) well region 43 having a predetermined space thereinside is provided in the surface of the silicon carbide layer 42. In the surface of the well region 43, provided are an n-type (first conductivity type) source region 44 and a $p^+$-type (second conductivity type) contact region 45 thereoutside. In the surface of silicon carbide layer 42, a JTE region 46 is further provided outside the well region 43. The JTE region 46 can be divided into two portions, i.e., a first JTE portion 46a and a second JTE portion 46b distinguished by concentration profiles of impurities therein. On the surface of silicon carbide layer 42, a gate electrode 50 is provided with a gate oxide film 49 being therebetween so as to cover at least a portion of the well region 43 (referred to as "channel region") between the source region 44 and the inner exposed space of the silicon carbide layer 42, and a source electrode 52 (a first electrode) is provided that is electrically connected with the source region 44 and the contact region 45. An interlayer insulation film 51 is further provided above the silicon carbide layer 42 so as to cover the gate electrode 50, and an insulation film 48 is provided above the silicon carbide layer 42 with an oxide film 47 being therebetween, outwardly along a peripheral region Y from the outer portion of the well region 43. A drain electrode (a second electrode) 53 is provided on the opposite surface of the silicon carbide substrate 41. Note that a region where the well region 43 is formed is a cell region X that acts as the MOSFET and the peripheral region Y is a region outside the cell region X, where the JTE region 46 is formed that relaxes an electric field concentration arising at the edge of its PN junction.

A manufacturing process for the MOSFET according to Embodiment 8 will be described with reference to FIGS. 28 through 37.

First, the n⁻-type silicon carbide layer 42 is formed on a surface of the n⁺-type silicon carbide substrate 41 by epitaxial crystal growth. The silicon carbide substrate 41 and the silicon carbide layer 42 constitute a silicon carbide wafer. (See FIG. 28.)

Next, a p-type first region 55 having a predetermined space thereinside is formed selectively in the surface of the silicon carbide layer 42 by ion-implanting (indicated by Arrows A in FIG. 29) aluminum (Al), which is a p-type impurity, using a resist 54 as a mask. After the ion implantation, the resist 54 is removed. (See FIG. 29.)

Next, a p⁻-type second region 57 is selectively formed outside the first region 55 in the surface of the silicon carbide layer 42 by ion-implanting (indicated by Arrows B in FIG. 30) aluminum (Al) and boron (B), which are p-type impurities, using a resist 56 as a mask. It should be noted that a p-type impurity concentration in the second region 57 is adjusted lower than that in the first region 55. After the ion implantation, the resist 56 is removed. (See FIG. 30.)

Next, the n-type source region 44 is formed selectively in the surface of the first region 55 by ion-implanting (indicated by Arrows C in FIG. 31) phosphorus (P) or nitrogen (N) (a third impurity), which are n-type impurities, using a resist 58 as a mask. After the ion implantation, the resist 58 is removed. (See FIG. 31.)

Next, the p⁺-type contact region 45 is selectively formed outside the source region 44 in the surface of the first region 55 by ion-implanting (indicated by Arrows D in FIG. 32) aluminum (Al), which is a p-type impurity, using a resist 59 as a mask. After the ion implantation, the resist 59 is removed. The forming of the contact region 45 is for reducing contact resistance between the well region 43 and the source electrode (the first electrode) 52 that are to be electrically connected with each other. (See FIG. 32.)

Next, the ion-implanted silicon carbide wafer is subject to an activation annealing treatment at a high temperature (for example, in an argon (Ar) atmosphere at 1,500° C. for 30 minutes), whereby the implanted ions are electrically activated and crystal defects caused by the ion implantation are also repaired at the same time. (See FIG. 33.)

The boron ion-implanted in the second region 57 diffuses into its neighboring zones in the silicon carbide layer 42 during the activation annealing treatment, whereby formed in the surface of the silicon carbide layer 42 are the well region 43 and the JTE region 46 thereoutside that consists of the first JTE portion 46a and the second JTE portion 46b. As has already been explained in Embodiment 1, the boron diffusion during the activation annealing treatment is large in the direction along the surface of the silicon carbide wafer and small in the depthwise direction.

Next, an oxide film 60 made of silicon dioxide ($SiO_2$) is formed on the surface of the silicon carbide layer 42 by thermal oxidation. (See FIG. 34.).

Next, a polysilicon film is formed on the surface of the oxide film 60 by chemical vapor deposition (CVD), and then, the gate electrode 50 is formed by removing a portion of the polysilicon film unnecessary therefor using a resist as a mask by wet etching or plasma etching. The gate electrode 50 is formed so as to cover at least the channel region, i.e., the portion of the well region 43 between the source region 44 and the inner exposed space of the silicon carbide layer 42. (See FIG. 34.)

Next, an insulation film 61 made of silicon dioxide ($SiO_2$) is formed over the gate electrode 50 and the oxide film 60 by a CVD with tetraethoxysilane (TEOS) gas. (See FIG. 34.)

Next, the insulation film 61 and the oxide film 60 are partially removed by wet etching or plasma etching using a resist as a mask so that the contact region 45 and a part of the source region 44 are exposed. After that, the resist is removed. Thereby, formation of the oxide film 47, the gate oxide film 49, the insulation film 48, and interlayer insulation film 51 are completed. (See FIG. 35.)

Next, a metal film made of aluminum (Al) or nickel (Ni) is formed over the exposed contact region 45, the exposed part of the source region 44, and the surfaces of the insulation film 48 and the interlayer insulation film 51 by physical vapor deposition (PVD) such as sputtering. On the surfaces of the contact region 45 and the part of the source region 44, the source electrode (the first electrode) 52 is then formed by removing a portion of the metal film unnecessary therefor using a resist as a mask. After that, the resist is removed. (See FIG. 36.)

Finally, the drain electrode (the second electrode) 53 is formed on the opposite surface of the silicon carbide substrate 41 by physical vapor deposition (PVD) such as sputtering. Up to this step, the main part of the MOSFET shown in FIG. 27 is completed.

A concentration profile of the p-type impurities in the JTE region 46 will be explained with reference to FIG. 37.

FIG. 37 shows a concentration profile of the p-type impurities in the JTE region 46 consisting of the first JTE portion 46a and the second JTE portion 46b. The first JTE portion 46a (zone I in the figure) is a region that is formed outside the well region 43 and has a p-type impurity concentration of substantially constant. The first JTE portion 46a keeps an initial p-type impurity concentration at the ion implantation, even after the activation annealing treatment. The second JTE portion 46b (zones II and III in the figure) is a region that is formed outside the first JTE portion 46a and has a p-type impurity concentration decreasing continuously outwardly along the peripheral region Y from the boundary of the first JTE portion 46a, that is, the p-type impurity concentration decreases continuously from that in the first JTE portion 46a to a concentration inverting to an n-type one. The concentration gradient in the second JTE portion 46b, as explained in the description of the manufacturing process, is developed during the activation annealing treatment by diffusion of the boron in the vicinity of the junction (zone II in the figure) of the second region 57 toward no boron-implanted region (zone III in the figure) of the silicon carbide layer 42.

The amounts and a ratio of boron and aluminum to be ion-implanted are adjusted so that such a concentration gradient of the p-type impurities is developed during the activation annealing treatment that the concentration in the JTE region 46 decreases from high to low, outwardly along the peripheral region Y.

In addition, the second JTE portion 47b formed by the diffusion of the boron becomes two to four μm in width. This width can also exhibit an effect sufficient for relaxing the electric field concentration, as is the case with two to four μm described in Embodiment 1.

In the manufacturing process according to Embodiment 8 of the invention, in the surface of the silicon carbide layer 42, the first region having a predetermined space thereinside is formed by ion-implanting aluminum as a p-type impurity and the second region 57 is formed thereoutside with its p-type impurity concentration lower than that in the first region 55 by ion-implanting aluminum and boron as p-type impurities; after that, by diffusing the boron ion-implanted in the second region 57 in the direction along the surface of the silicon carbide layer 42 by the activation annealing treatment, formed are the well region 43 and the JTE region 46 in which a concentration gradient of the p-type impurities is developed such that the concentration in the JTE region 46 decreases from high to low, outwardly along the peripheral region Y. Thereby, the JTE region 46 includes a plurality of p-type portions where the impurity concentration decreases stepwise, which allows formation of the JTE region 46 having a wide range of p-type impurity concentration and having a desired breakdown voltage by a standard activation annealing treatment after ion implantation. For that reason, there is no need for such many manufacturing steps as those in a conventional manufacturing process to form a JTE region consisting of a plurality of p-type portions in which a p-type impurity concentration decreases stepwise outwardly along the peripheral region. This streamlining of manufacturing process lead to reduction in manufacturing costs, enabling cost reduction of silicon carbide semiconductor devices.

Embodiment 9

While Embodiment 8 has been described in which the JTE region 46 having a wide range of p-type impurity concentration is formed by the activation annealing treatment after the first region 55 and the second region 57 are formed by ion implantation, three or more ion-implanted regions may be formed. Embodiment 9 of the invention will be described below in which three regions are formed by ion implantation.

Figure 38:
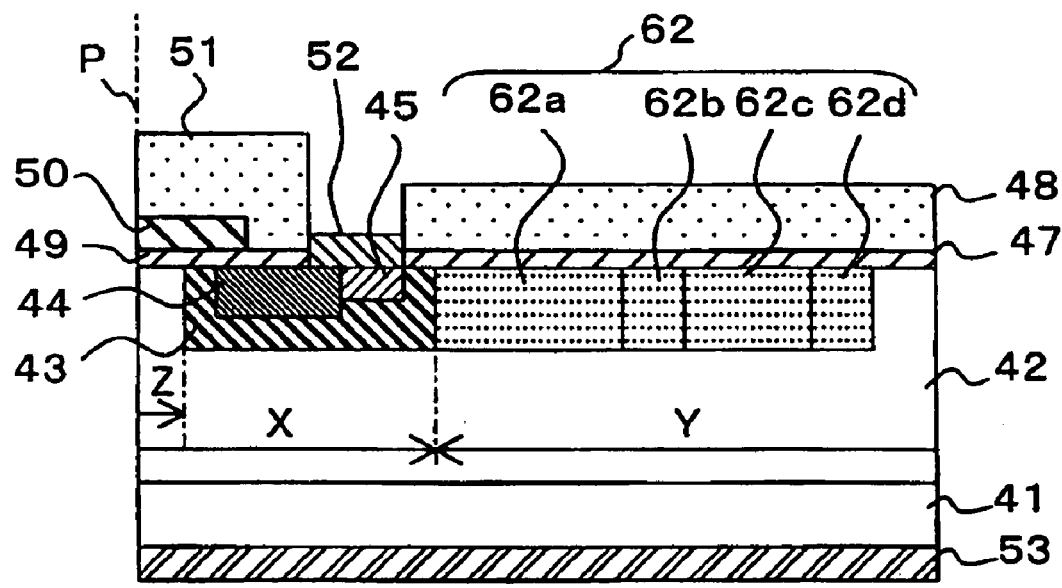
FIG. 38 is a cross-sectional view illustrating a structure of a metal oxide semiconductor field effect transistor (MOSFET) of a silicon carbide semiconductor device according to Embodiment 9 of the invention.
Figure 39:
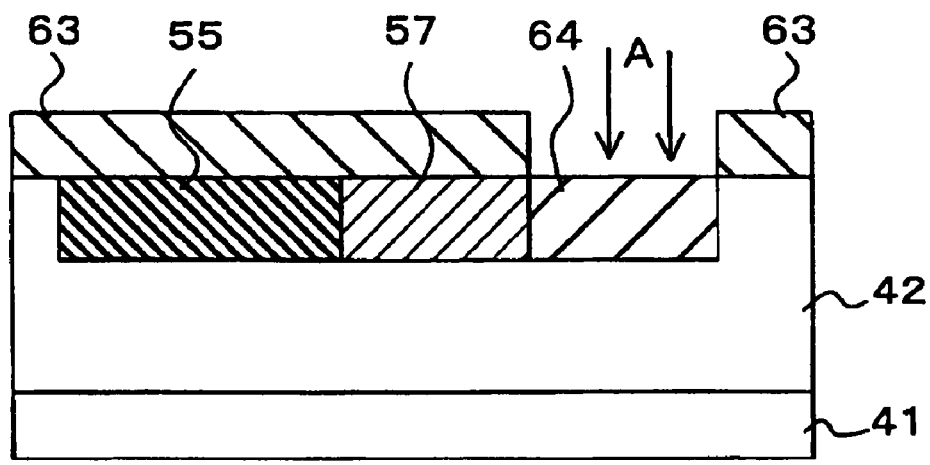
FIG. 39 is a view illustrating a step in a manufacturing process for the MOSFET according to Embodiment 9.
Figure 40:
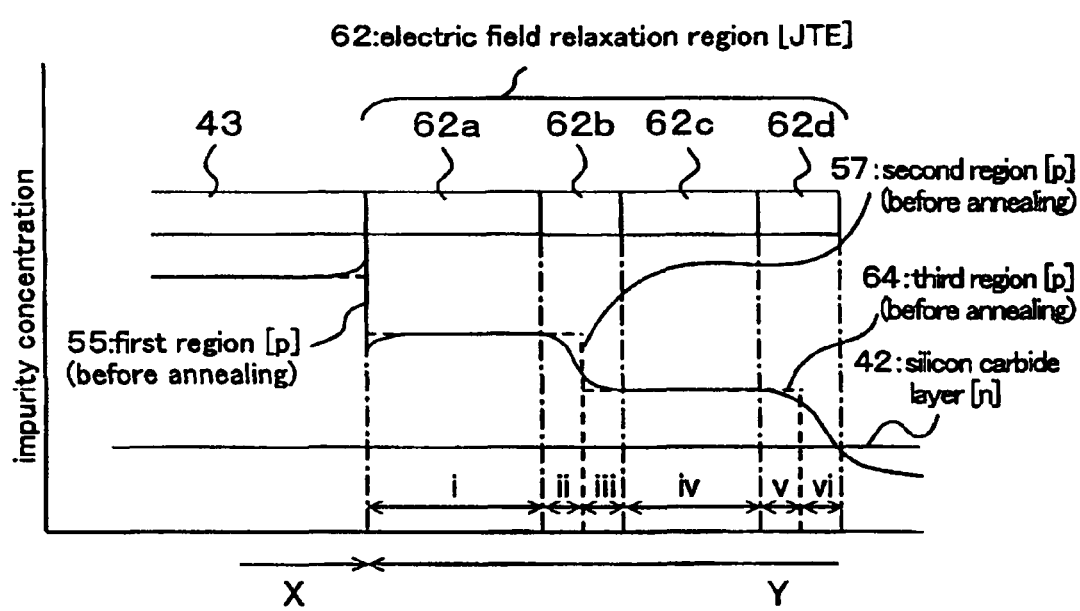
FIG. 40 is a graph illustrating a concentration profile of p-type impurities in the JTE region after an activation annealing treatment, of the MOSFET according to Embodiment 9.

FIG. 38 is a cross-sectional view illustrating a structure of a metal oxide semiconductor field effect transistor (MOSFET) according to Embodiment 9, where the half of the MOSFET structure is shown since its actual structure is symmetric with respect to its center P. FIG. 39 is a view illustrating a manufacturing process for the MOSFET, where shown is a manufacturing step different from that in the manufacturing process for the MOSFET according to Embodiment 8. FIG. 40 is a graph showing a concentration profile of p-type impurities in a JTE region after an activation annealing treatment, of the MOSFET according to Embodiment 9. Note that in FIGS. 38 to 40, the same reference numerals as in FIG. 27 of Embodiment 8 indicate elements the same as or equivalent to those in FIG. 27; hence, their explanations are omitted here.

Difference in structure from Embodiment 8 is in that a p⁻-type (second conductivity type) JTE region 62 is provided in the surface of the silicon carbide layer 42, instead of the p⁻-type (second conductivity type) JTE region 46. The JTE region 62 can be divided into four portions, i.e., a first JTE portion 62a through a fourth JTE portion 62d distinguished by concentration profiles of p-type impurities therein. Similarly to Embodiment 8, a region where a well region 43 is formed is a cell region X that acts as the MOSFET, and a region outside the cell region X is a peripheral region Y where the JTE region 62 is formed that relaxes an electric field concentration arising at the edge of its PN junction.

A manufacturing process for the MOSFET according to Embodiment 9 will be described. Here, a step in the manufacturing process different from that explained in Embodiment 8 is explained.

The manufacturing step illustrated in FIG. 39 is carried out after that of forming the second region 57 having been explained in Embodiment 8. Specifically, a third region 64 of p⁻-type is formed outside a second region 57 in the surface of the silicon carbide layer 42 by ion-implanting (indicated by Arrows A in FIG. 39) aluminum (Al) and boron (B), which are p-type impurities, using a resist 63 as a mask. A p-type impurity concentration in the third region 64 is adjusted lower than that in the second region 57. After the ion implantation, the resist 63 is removed.

Manufacturing steps after forming the third region 64 are almost the same as those in and after the activation annealing treatment described in Embodiment 8. Note that, in Embodiment 9, the boron ion-implanted in the second region 57 and the third region 64 diffuses, as shown in FIG. 38, into their neighboring zones in the silicon carbide layer 42 during the activation annealing treatment, whereby formed in the surface of the silicon carbide layer 42 is the JTE region 62 consisting of the first JTE portion 62a to the fourth JTE portion 62d and the region inside the first JTE portion 62a in the cell region X becomes the well region 43.

A concentration profile of the p-type impurities in the JTE region 62 will be explained with reference to FIG. 40.

FIG. 40 shows a concentration profile of the p-type impurities in the JTE region 62 consisting of the first JTE portion 62a, the second JTE portion 62b, the third JTE portion 62c, and the fourth JTE portion 62d. The first JTE portion 62a (zone i in the figure) is a region that is formed outside the well region 43 in the peripheral region Y and has a p-type impurity concentration of substantially constant. The first JTE portion 62a keeps an initial p-type impurity concentration at the ion implantation, even after the activation annealing treatment. The second JTE portion 62b (zones ii and iii in the figure) is a region that is formed outside the first JTE portion 62a in the peripheral region Y and has a p-type impurity concentration decreasing continuously outwardly along the peripheral region Y from the boundary of the first JTE portion 62a, that is, the p-type impurity concentration decreases continuously from that in the first JTE portion 62a to that in the third JTE portion 62c. The third JTE portion 62c (zone iv in the figure) is a region that is formed outside the second JTE portion 62b and has a p-type impurity concentration of substantially constant. The third JTE portion 62c also keeps an initial p-type impurity concentration at the ion implantation, even after the activation annealing treatment. The fourth JTE portion 62d (zones v and vi in the figure) is a region that is formed outside the third JTE portion 62c in the peripheral region Y and has a p-type impurity concentration decreasing continuously from that in the third JTE portion 62c to a concentration inverting to an n-type one, outwardly along the peripheral region Y from the boundary of the third JTE portion 62c. The concentration gradient in the second JTE portion 62b is developed during the activation annealing treatment by diffusion of the boron in the vicinity of the boundary (zone ii in the figure) of the second region 57 toward the low-boron-concentration third region 64 (zone iii in the figure). The concentration gradient in the fourth JTE portion 62d is developed during the activation annealing treatment by diffusion of the boron in the vicinity of the junction (zone v in the figure) of the third region 64 toward no boron-implanted region (zone vi in the figure) of the silicon carbide layer 42.

The amounts and ratios of boron and aluminum to be ion-implanted are adjusted so that such a concentration gradient of the p-type impurities is developed during the activation annealing treatment that the concentration in the JTE region 62 decrease from high to low, outwardly along the peripheral region Y.

In addition, the second JTE portion 62b and the fourth JTE portion 62d formed by the diffusion of the boron each become two to four μm in width. This width can also exhibit an effect sufficient for relaxing the electric field concentration, as is the case with two to four μm described in Embodiment 1.

In the manufacturing process of Embodiment 9 of the invention, in the surface of the silicon carbide layer 42, the first region 55 having a predetermined space thereinside is formed by ion-implanting aluminum as a p-type impurity, the second region 57 is formed thereoutside with its p-type impurity concentration lower than that in the first region 55 by ion-implanting aluminum and boron as p-type impurities, and the third region 64 is further formed thereoutside with its p-type impurity concentration lower than that in the second region 57 by ion-implanting aluminum and boron as p-type impurities; after that, by diffusing the boron ion-implanted in the second region 57 and the third region 64 in the direction along the surface of the silicon carbide layer 42 by the activation annealing treatment, formed are the well region 43 and the JTE region 62 in which a concentration gradient of the p-type impurities is developed such that the concentration in the JTE region 62 decreases from high to low, outwardly along the peripheral region Y. Thereby, the JTE region 62 includes the plurality of p-type portions where the impurity concentration decreases stepwise, which allows formation of the JTE region 62 having a wide range of p-type impurity concentration and having a desired breakdown voltage by a standard activation annealing treatment after ion implantation. For that reason, there is no need for such many manufacturing steps as those in a conventional manufacturing process to form a JTE region consisting of a plurality of p-type portions in which the p-type impurity concentration decreases stepwise outwardly along the peripheral region. This streamlining of manufacturing process lead to reduction in manufacturing costs, enabling cost reduction of silicon carbide semiconductor devices.

While Embodiment 9 has been described taking an example in which three ion-implanted regions are provided to form a JTE region by an activation annealing treatment, more than three ion-implanted regions may be provided to form a JTE region. Similarly to Embodiment 9, forming a plurality of ion-implanted regions where the p-type impurity concentration decreases stepwise outwardly along the peripheral region and then treating the ion-implanted region by an activation annealing, a JTE region can be formed in which a concentration gradient of the p-type impurities is developed such that the concentration therein decreases from high to low, outwardly along the peripheral region Y from the edge of the well region 43. The JTE region, since it includes a plurality of p-type portions having a wide range of p-type impurity concentration that decreases stepwise, can be designed to have a desired breakdown voltage.

In addition, since only aluminum is ion-implanted to form the first region 55 in the manufacturing methods for a silicon carbide semiconductor device according to Embodiment 8 and Embodiment 9, the space inside the well region 43, in other wards, the inner space of the silicon carbide layer 42 (indicated by "Z" in FIGS. 27 and 38) never becomes narrower in the step of forming the well region 43 by the activation annealing treatment, whereby it is possible to prevent channel resistance from increasing due to increase in channel length and to prevent JFET (junction field effect transistor) resistance from increasing due to reduction in space inside the well region 43.

Furthermore, also in Embodiment 8 and Embodiment 9, if a second region 57 is ion-implanted with boron deeper than or equal to the first region 55, a p-type region (not shown) is formed so as to underlie the outer edge of the well region 43, as with the case shown in FIGS. 21 and 22, by slight diffusion of the boron in the depthwise direction of the silicon carbide wafer during the activation annealing treatment. This p-type region exhibits an effect of relaxing the electric field concentration arising at the lower outer edge of the well region 43.

In Embodiment 1 through Embodiment 9, manufacturing processes for silicon carbide semiconductor devices are described, in which used are aluminum as a p-type impurity (a first impurity) and nitrogen or phosphorus as an n-type impurity (a third impurity) that hardly diffuse (non-diffusible) into the silicon carbide layer during the activation annealing treatment, and boron as a p-type impurity (a second impurity) that easily diffuses (diffusible) into the silicon carbide layer during the activation annealing treatment. However, any other impurity can be used as long as it has a characteristic comparable to that the above impurities have, to be more specific, as long as it exhibits a comparable diffusion characteristic in the silicon carbide layer during the activation annealing treatment. Using such an impurity is also included, as a matter of course, within the scope of the present invention.

What is claimed is:

1. A method of manufacturing a silicon carbide semiconductor device, comprising:
    a step of forming in a surface of a silicon carbide wafer of first conductivity type a first region of second conductivity type having a predetermined space thereinside, by ion-implanting a first impurity that is non-diffusible during an activation annealing treatment and can form a second conductivity type region in the silicon carbide wafer and a second impurity that is diffusible during the activation annealing treatment and can form a second conductivity type region in the silicon carbide wafer;
    a step of forming a JTE region in the surface of the silicon carbide wafer from the first region by diffusing the second impurity ion-implanted in the first region toward its neighboring zones by the activation annealing treatment;
    a step of forming a first electrode on a surface area of the silicon carbide wafer at the space inside the first region and at an inner part of the first region; and
    a step of forming a second electrode on the opposite surface of the silicon carbide wafer.

2. The method of manufacturing the silicon carbide semiconductor device as set forth in claim 1, wherein the first impurity is aluminum and the second impurity is boron.

3. A method of manufacturing a silicon carbide semiconductor device, comprising:
    a step of forming in a surface of a silicon carbide wafer of first conductivity type a first region of second conductivity type having a predetermined space thereinside, by ion-implanting a first impurity that is non-diffusible during an activation annealing treatment and can form a second conductivity type region in the silicon carbide wafer;
    a step of forming in the surface of the silicon carbide wafer at least one region of second conductivity type outside the first region by ion-implanting the first impurity and a second impurity that is diffusible during the activation annealing treatment and can form a second conductivity type region in the silicon carbide wafer, so that a concentration of the impurities for the second conductivity type in the at least one region decreases stepwise from that of the impurity in the first region;

a step of forming a JTE region in the silicon carbide wafer from the first region and from the at least one region by diffusing the second impurity ion-implanted in the at least one region toward its neighboring zones by the activation annealing treatment;

a step of forming a first electrode on a surface area of the silicon carbide wafer at the space inside the first region and at an inner part of the first region; and a step of forming a second electrode on the opposite surface of the silicon carbide wafer.

4. The method of manufacturing the silicon carbide semiconductor device as set forth in claim 3, wherein the first impurity is aluminum and the second impurity is boron.

5. The method of manufacturing the silicon carbide semiconductor device as set forth in claim 3, wherein the second impurity is further ion-implanted into the first region, and then, the second impurity ion-implanted in the first region and in the at least one region is diffused toward their respective neighboring zones during the activation annealing treatment.

6. The method of manufacturing the silicon carbide semiconductor device as set forth in claim 5, wherein the first impurity is aluminum and the second impurity is boron.

7. A method of manufacturing a silicon carbide semiconductor device, comprising:

a step of forming in a surface of a silicon carbide wafer of first conductivity type a first region of second conductivity type by ion-implanting a first impurity that is non-diffusible during an activation annealing treatment and can form a second conductivity type region in the silicon carbide wafer;

a step of forming in the surface of the silicon carbide wafer at least one region of second conductivity type outside the first region by ion-implanting the first impurity and a second impurity that is diffusible during the activation annealing treatment and can form a second conductivity type region in the silicon carbide wafer, so that a concentration of the impurities for the second conductivity type in the at least one region decreases stepwise from that of the impurity in the first region;

a step of forming in the silicon carbide wafer a well region from the first region and a JTE region thereoutside from the at least one region by diffusing the second impurity ion-implanted in the at least one region toward its neighboring zones by the activation annealing treatment;

a step of forming a first electrode on the surface of the well region; and a step of forming a second electrode on the opposite surface of the silicon carbide wafer.

8. The method of manufacturing the silicon carbide semiconductor device as set forth in claim 7, wherein the first impurity is aluminum and the second impurity is boron.

9. The method of manufacturing the silicon carbide semiconductor device as set forth in claim 7, wherein the second impurity is further ion-implanted into the first region, and then, the second impurity ion-implanted in the first region and in the at least one region is diffused toward their respective neighboring zones during the activation annealing treatment.

10. The method of manufacturing the silicon carbide semiconductor device as set forth in claim 9, wherein the first impurity is aluminum and the second impurity is boron.

11. The method of manufacturing the silicon carbide semiconductor device as set forth in claim 7, wherein one of the at least one region adjacent to the first region is formed deeper than or equal to the first region.

12. The method of manufacturing the silicon carbide semiconductor device as set forth in claim 11, wherein the first impurity is aluminum and the second impurity is boron.

13. A method of manufacturing a silicon carbide semiconductor device, comprising:

a step of forming in a surface of a silicon carbide wafer of first conductivity type a first region of second conductivity type having a predetermined space thereinside, by ion-implanting a first impurity that is non-diffusible during an activation annealing treatment and can form a second conductivity type region in the silicon carbide wafer;

a step of forming in the surface of the silicon carbide wafer at least one region of second conductivity type outside the first region by ion-implanting the first impurity and a second impurity that is diffusible during the activation annealing treatment and can form a second conductivity type region in the silicon carbide wafer, so that a concentration of the impurities for the second conductivity type in the at least one region decreases stepwise from that of the impurity in the first region;

a step of forming in the surface of the first region a source region of first conductivity type by ion-implanting a third impurity that is non-diffusible during the activation annealing treatment and can form a first conductivity type region in the silicon carbide wafer;

a step of forming in the surface of the silicon carbide wafer a well region including the source region from the first region and a JTE region outside the well region from the at least one region by diffusing the second impurity ion-implanted in the at least one region toward its neighboring zones by the activation annealing treatment;

a step of forming on the surface of the silicon carbide wafer a gate electrode so as to cover a channel region of the well region, with a gate oxide film between the silicon carbide wafer and gate electrode;

a step of forming on the surface of the silicon carbide wafer a first electrode electrically connected with the source region and the well region; and a step of forming a second electrode on the opposite surface of the silicon carbide wafer.

14. The method of manufacturing the silicon carbide semiconductor device as set forth in claim 13, wherein the first impurity is aluminum and the second impurity is boron.

15. The method of manufacturing the silicon carbide semiconductor device as set forth in claim 13, wherein the third impurity is nitrogen or phosphorus.

16. The method of manufacturing the silicon carbide semiconductor device as set forth in claim 13, wherein one of the at least region adjacent to the first region is formed deeper than or equal to the first region.

17. The method of manufacturing the silicon carbide semiconductor device as set forth in claim 16, wherein the first impurity is aluminum and the second impurity is boron.

18. The method of manufacturing the silicon carbide semiconductor device as set forth in claim 16, wherein the third impurity is nitrogen or phosphorus.

* * * * *